(12) United States Patent  (10) Patent No.: US 9,189,307 B2
Williams et al.  (45) Date of Patent: *Nov. 17, 2015

(54) METHOD OF IMPROVING THE PERFORMANCE OF AN ACCESS NETWORK FOR COUPLING USER DEVICES TO AN APPLICATION SERVER

(71) Applicant: LiveQoS Inc., Ottawa (CA)

(72) Inventors: Matthew Robert Williams, Kanata (CA); Mohan Krishna Vemulapali, Nepean (CA); Martin William Horne, Woodlawn (CA); James Robert McMillan, Dunrobin (CA)

(73) Assignee: LIVEQOS INC., Ottawa (CA)

( * ) Notice: Subject to any disclaimer, the term of this patent is extended or adjusted under 35 U.S.C. 154(b) by 378 days.

This patent is subject to a terminal disclaimer.

(21) Appl. No.: 13/738,006

(22) Filed: Jan. 10, 2013

(65) Prior Publication Data

US 2013/0124682 A1  May 16, 2013

Related U.S. Application Data

(63) Continuation-in-part of application No. 13/021,357, filed on Feb. 4, 2011, now Pat. No. 8,437,370, and a continuation-in-part of application No. 12/959,944, filed on Dec. 3, 2010, which is a continuation of (Continued)

(51) Int. Cl.
*H04L 1/00* (2006.01)
*G06F 11/00* (2006.01)
(Continued)

(52) U.S. Cl.
CPC .............. *G06F 11/004* (2013.01); *H03M 13/00* (2013.01); *H04L 1/0009* (2013.01);
(Continued)

(58) Field of Classification Search
CPC ....... H04L 1/0009; H04L 47/10; H04L 47/22; H03M 13/00; H04N 21/6405
See application file for complete search history.

(56) References Cited

U.S. PATENT DOCUMENTS 4,908,827 A   3/1990 Gates
5,600,663 A   2/1997 Ayanoglu et al.
(Continued)

FOREIGN PATENT DOCUMENTS

CA   2450563   12/2002
CN   1343410   4/2002
(Continued)

OTHER PUBLICATIONS

Barakat, C.; Simulation-Based Study of link level Hybrid FEC/ARQ-SR for Wireless Links and Long-Lived TCP Traffic, INRIA Research Report RR-4752; Feb. 2003 (8 pages).

(Continued)

*Primary Examiner* — Andrew Chriss
*Assistant Examiner* — Salvador E Rivas
(74) *Attorney, Agent, or Firm* — Nixon Peabody LLP

(57) ABSTRACT

A system is provided for improving the performance of an access network for coupling user devices to an application server. The system includes a user device coupled to an intermediate server via the access network. The user device has a processor adapted to encode data using a network performance enhancing coding (NPEC), and to transmit the encoded data via the access network to the intermediate server. The intermediate server is adapted to receive the encoded data and has a processor adapted to decode the encoded data using the NPEC, and to transmit the decoded data to the application server.

8 Claims, 25 Drawing Sheets

Related U.S. Application Data application No. 12/193,345, filed on Aug. 18, 2008, now Pat. No. 8,009,696, which is a continuation-in-part of application No. 10/912,200, filed on Aug. 6, 2004, now Pat. No. 7,742,501.

(51) Int. Cl.
  *H03M 13/00* (2006.01)
  *H04L 12/26* (2006.01)
  *H04N 21/6405* (2011.01)
  *H04L 12/801* (2013.01)
  *H04L 12/815* (2013.01)
  *H04L 12/823* (2013.01)

(52) U.S. Cl.
  CPC ......... *H04L 1/0057* (2013.01); *H04L 43/0829* (2013.01); *H04L 43/16* (2013.01); *H04L 47/34* (2013.01); *H04L 47/10* (2013.01); *H04L 47/22* (2013.01); *H04L 47/32* (2013.01); *H04L 2001/0097* (2013.01); *H04N 21/6405* (2013.01)

(56) References Cited

U.S. PATENT DOCUMENTS

| | | | |
|---|---|---|---|
| 5,677,918 | A | 10/1997 | Tran et al. |
| 5,751,970 | A | 5/1998 | Bournas |
| 5,857,072 | A | 1/1999 | Crowle |
| 6,000,053 | A | 12/1999 | Levine et al. |
| 6,012,159 | A | 1/2000 | Fischer et al. |
| 6,126,310 | A | 10/2000 | Osthoff et al. |
| 6,172,972 | B1 | 1/2001 | Birdwell et al. |
| 6,272,148 | B1 | 8/2001 | Takagi et al. |
| 6,272,658 | B1 | 8/2001 | Steele et al. |
| 6,278,716 | B1 | 8/2001 | Rubenstein et al. |
| 6,336,200 | B1 | 1/2002 | Wolfgang |
| 6,421,387 | B1 | 7/2002 | Rhee |
| 6,421,805 | B1 | 7/2002 | McAuliffe |
| 6,438,108 | B1 | 8/2002 | Kanljung et al. |
| 6,445,717 | B1 | 9/2002 | Gibson et al. |
| 6,449,251 | B1 | 9/2002 | Awadallah et al. |
| 6,529,552 | B1 | 3/2003 | Tsai |
| 6,570,843 | B1 | 5/2003 | Wolfgang |
| 6,606,723 | B2 | 8/2003 | Wolfgang |
| 6,609,223 | B1 | 8/2003 | Wolfgang |
| 6,728,924 | B1 | 4/2004 | Lou et al. |
| 6,744,766 | B2 | 6/2004 | Alapuranen |
| 6,868,083 | B2 | 3/2005 | Apostolopoulos et al. |
| 6,876,669 | B2 | 4/2005 | Shalom |
| 6,901,051 | B1 | 5/2005 | Hou et al. |
| 7,016,409 | B2 | 3/2006 | Unger |
| 7,024,609 | B2 | 4/2006 | Wolfgang et al. |
| 7,035,217 | B1 | 4/2006 | Vicisano |
| 7,050,396 | B1 | 5/2006 | Cohen |
| 7,065,482 | B2 | 6/2006 | Shorey et al. |
| 7,075,936 | B2 | 7/2006 | Hathaway et al. |
| 7,089,478 | B2 | 8/2006 | Cummings et al. |
| 7,133,407 | B2 | 11/2006 | Jinzaki et al. |
| 7,167,704 | B2 | 1/2007 | Chang |
| 7,215,683 | B2 | 5/2007 | Burkert et al. |
| 7,236,481 | B2 | 6/2007 | Kim |
| 7,310,670 | B1 | 12/2007 | Walbeck et al. |
| 7,319,701 | B2 | 1/2008 | Guven et al. |
| 7,522,606 | B1 | 4/2009 | Sendrovitz |
| 7,609,716 | B2 | 10/2009 | Brown et al. |
| 7,720,063 | B2 | 5/2010 | Maiorana et al. |
| 7,739,398 | B1 | 6/2010 | Shabtay |
| 7,742,501 | B2 | 6/2010 | Williams |
| 7,801,044 | B2 | 9/2010 | Moutarlier |
| 7,821,937 | B1 | 10/2010 | Guo |
| 7,889,654 | B2 | 2/2011 | Ramakrishnan et al. |
| 7,936,785 | B2 | 5/2011 | Ehret et al. |
| 7,953,114 | B2 | 5/2011 | Williams et al. |
| 8,009,696 | B2 | 8/2011 | Williams et al. |
| 8,045,563 | B2 | 10/2011 | Lee |
| 8,437,370 | B2 | 5/2013 | Williams et al. |
| 2001/0009547 | A1 | 7/2001 | Jinzaki et al. |
| 2001/0040883 | A1 | 11/2001 | Chang et al. |
| 2002/0034173 | A1* | 3/2002 | Border et al. .................. 370/338 |
| 2002/0061059 | A1 | 5/2002 | Ginesi |
| 2002/0141448 | A1 | 10/2002 | Matsunaga |
| 2002/0146016 | A1 | 10/2002 | Liu et al. |
| 2002/0154631 | A1 | 10/2002 | Makansi et al. |
| 2002/0164024 | A1 | 11/2002 | Arakawa et al. |
| 2003/0002499 | A1 | 1/2003 | Cummings et al. |
| 2003/0018793 | A1 | 1/2003 | Mora |
| 2003/0035440 | A1 | 2/2003 | Casaccia et al. |
| 2003/0053461 | A1 | 3/2003 | Ross |
| 2003/0105997 | A1 | 6/2003 | Mitlin |
| 2003/0108044 | A1 | 6/2003 | Hendel |
| 2003/0152058 | A1 | 8/2003 | Cimini, Jr. |
| 2003/0161298 | A1* | 8/2003 | Bergman et al. ............... 370/352 |
| 2003/0219034 | A1 | 11/2003 | Lotter et al. |
| 2004/0010736 | A1 | 1/2004 | Alapuranin |
| 2004/0015686 | A1 | 1/2004 | Connor et al. |
| 2004/0037312 | A1* | 2/2004 | Spear ........................... 370/465 |
| 2004/0039827 | A1 | 2/2004 | Thomas |
| 2004/0095885 | A1 | 5/2004 | Yang |
| 2004/0160943 | A1 | 8/2004 | Cain |
| 2004/0196785 | A1 | 10/2004 | Janakiraman et al. |
| 2004/0213197 | A1 | 10/2004 | Zimmerman et al. |
| 2004/0264396 | A1 | 12/2004 | Ginzburg et al. |
| 2004/0267945 | A1 | 12/2004 | Reiss |
| 2005/0025185 | A1 | 2/2005 | Brown et al. |
| 2005/0053002 | A1 | 3/2005 | Chan et al. |
| 2005/0130646 | A1 | 6/2005 | Frank et al. |
| 2005/0195859 | A1 | 9/2005 | Mahany |
| 2005/0213586 | A1 | 9/2005 | Cyganski et al. |
| 2005/0259577 | A1 | 11/2005 | Sin |
| 2005/0259637 | A1* | 11/2005 | Chu et al. ..................... 370/352 |
| 2006/0018315 | A1 | 1/2006 | Baratakke et al. |
| 2006/0029101 | A1 | 2/2006 | Williams |
| 2006/0031518 | A1 | 2/2006 | Jennings, III |
| 2006/0031847 | A1 | 2/2006 | Macdonald et al. |
| 2006/0106598 | A1 | 5/2006 | Trombetta et al. |
| 2006/0165163 | A1 | 7/2006 | Burazerovic et al. |
| 2006/0178143 | A1 | 8/2006 | Chang et al. |
| 2006/0210037 | A1 | 9/2006 | Olafsson |
| 2006/0245384 | A1 | 11/2006 | Talukdar et al. |
| 2006/0268717 | A1 | 11/2006 | Kanterakis |
| 2007/0011321 | A1 | 1/2007 | Huntington et al. |
| 2007/0076680 | A1 | 4/2007 | Amram et al. |
| 2007/0116052 | A1 | 5/2007 | Yu et al. |
| 2007/0157060 | A1 | 7/2007 | Ganga |
| 2008/0089268 | A1 | 4/2008 | Kinder et al. |
| 2008/0095247 | A1 | 4/2008 | Ohno et al. |
| 2008/0151776 | A1 | 6/2008 | Kure |
| 2008/0151823 | A1 | 6/2008 | Quigley |
| 2008/0240108 | A1 | 10/2008 | Hyldgaard |
| 2008/0304483 | A1 | 12/2008 | Williams et al. |
| 2009/0006920 | A1 | 1/2009 | Munson et al. |
| 2009/0049189 | A1 | 2/2009 | Zhu et al. |
| 2009/0116487 | A1 | 5/2009 | Read |
| 2009/0135950 | A1 | 5/2009 | Hoffman |
| 2009/0268742 | A1 | 10/2009 | Hama |
| 2009/0268747 | A1 | 10/2009 | Kurata et al. |
| 2010/0005177 | A1 | 1/2010 | Cagenius |
| 2010/0023842 | A1 | 1/2010 | Rahrer et al. |
| 2010/0080167 | A1 | 4/2010 | Cordeiro |
| 2010/0272122 | A1 | 10/2010 | Williams et al. |
| 2011/0044338 | A1 | 2/2011 | Stahl et al. |
| 2011/0103388 | A1 | 5/2011 | Williams et al. |
| 2011/0206043 | A1 | 8/2011 | Williams et al. |
| 2012/0201136 | A1 | 8/2012 | Williams et al. |
| 2012/0203893 | A1 | 8/2012 | Williams et al. |
| 2012/0213232 | A1 | 8/2012 | Williams et al. |
| 2012/0287806 | A1 | 11/2012 | Williams |
| 2015/0039723 | A1* | 2/2015 | Williams et al. ............... 709/217 |

FOREIGN PATENT DOCUMENTS

| | | |
|---|---|---|
| EP | 1049299 | 11/2000 |
| EP | 1 755 248 | 2/2007 |
| JP | 10-119426 | 5/1998 |

(56) References Cited

FOREIGN PATENT DOCUMENTS

| | | |
|---|---|---|
| JP | 10-174069 | 6/1998 |
| JP | 11-225161 | 8/1999 |
| JP | 2000-151623 | 5/2000 |
| JP | 2001-119426 | 4/2001 |
| JP | 2001-345854 | 12/2001 |
| JP | 2002-077258 | 3/2002 |
| JP | 2002-290459 | 10/2002 |
| JP | 2003-196618 | 7/2003 |
| JP | 2003-198618 | 7/2003 |
| JP | 2003-298560 | 10/2003 |
| JP | 2004-187286 | 7/2004 |
| JP | 2005-287016 | 10/2005 |
| JP | 2007-184836 | 7/2007 |
| JP | 2008-509580 | 3/2008 |
| JP | 2008-153778 | 7/2008 |
| WO | 98/20511 | 5/1998 |
| WO | 00/48366 | 8/2000 |
| WO | 2009/020876 | 2/2009 |

OTHER PUBLICATIONS

European Search Report issued in European Patent Application No. 09167948.0, dated Nov. 26, 2009 (5 pages).
European Search Report issued in European Patent Application No. 12181248.1, dated Sep. 10, 2012 (6 pages).
International Search Report, PCT/CA2005/001206, mailed Jun. 22, 2011 (2 pages).
International Search Report, PCT/IB2011/050917, mailed Jun. 22, 2011 (3 pages).
International Search Report, PCT/IB2012/050473, mailed Aug. 24, 2012 (3 pages).
International Written Opinion, PCT/CA2005/001206, mailed Jun. 22, 2011 (6 pages).
International Written Opinion, PCT/IB2011/050917, mailed Jun. 22, 2011 (4 pages).
International Written Opinion, PCT/IB2012/050473, mailed Aug. 24, 2012 (6 pages).
Notice of Allowance issued in U.S. Appl. No. 10/912,200, dated Mar. 1, 2010 (4 pages).
Office Action issued in Japanese Patent Application No. 2007-524146 dated Sep. 28, 2010 (9 pages).
European Patent Application No. 09167948.0 Search Report, dated Nov. 26, 2009 (5 pages).
European Patent Application No. 12181248.1 Search Report, dated Sep. 10, 2012 (6 pages).
Japanese Patent Application No. 2007-524146, Office Action dated Sep. 28, 2010 (9 pages).
Border, J. et al. "Performance Enhancing Proxies Intended to Mitigate Link-Related Degradations." Network Working Group—Category: Informational. Jun. 1, 2001 (46 pages).
Mahy, R. et al. "Traversal Using Relays Around NAT (TURN): Relay Extensions to Session Traversal Utilities for NAT (STUN)." Internet Engineering Task Force (IETF)—Category: Standards Track. Apr. 29, 2010 (68 pages).
Extended European Search Report mailed Jun. 26, 2014 which issued in European Patent Application No. 12744550.0 (5 pages).
Extended European Search Report mailed May 14, 2014 which issued in European Patent Application No. 14150050.4 (7 pages).
European Search Report mailed Sep. 2, 2013 which issued in European Patent Application No. 13177433.3 (5 pages).
Pfaffenberger, B. "Central Processing Unit." Webster's New World Computer Dictionary. Ninth Edition. New York: Hungry Minds, Inc., 2001.

* cited by examiner

METHOD OF IMPROVING THE PERFORMANCE OF AN ACCESS NETWORK FOR COUPLING USER DEVICES TO AN APPLICATION SERVER

CROSS-REFERENCE TO RELATED APPLICATION(S)

This application claims priority to, and is a continuation-in-part of, U.S. patent application Ser. No. 13/021,357, filed Feb. 4, 2011, and U.S. patent application Ser. No. 12/959,944, filed Dec. 3, 2010, which in turn is a continuation of U.S. patent application Ser. No. 12/193,345, filed Aug. 18, 2008, now U.S. Pat. No. 8,009,696, which in turn is a continuation-in-part of U.S. patent application Ser. No. 10/912,200, filed Aug. 6, 2004, now U.S. Pat. No. 7,742,501, all of which are herein incorporated by reference in their entirety.

FIELD OF THE INVENTION

The present invention relates to communication data networks. More specifically, the present invention relates to systems and methods for increasing the throughput of data transmissions through a network as seen from the edge of the network.

BACKGROUND OF THE INVENTION

To enable data communication from a source end-station or network to a destination end-station or network, packet-based networks break-up data streams into smaller packets of data. As these packets traverse a network, some of these packets can be lost due to congestion or other network limitations. This loss can have a tremendous impact on the applications leveraging the communication channel between the source and destination end-stations. Ideally, a network, from the point of view of many applications, must provide perfect performance with deterministic packet latency and no packet loss. However, the capital and operational cost to achieve perfect network performance is not practical for most service and enterprise network providers.

Accordingly, systems and methods are required which can be used with low cost networks to provide applications with a high network performance. One approach is to create new encoding protocol stacks which are installed at the end-stations to improve the response to loss and latency. However, this approach is non-trivial since all end-stations in the source and destination networks must be upgraded to use the new encoding protocol stacks.

Another approach uses network devices that intercept standard protocols, and an encoding protocol between the intercepting network devices, to recover from network loss. These devices are deployed in areas of the network where resident applications require better network performance than what is generally available in the network itself. Such devices are described in pending U.S. application Ser. No. 12/718,650, filed Mar. 5, 2010, which is a continuation-in-part of U.S. application Ser. No. 12/193,345, filed Aug. 18, 2008, which is a continuation-in-part of U.S. application Ser. No. 10/912,200, filed Aug. 6, 2004 now U.S. Pat. No. 7,742,501.

The encoding protocol is intended to reduce loss. To achieve this goal, the encoding protocol increases the overall bandwidth required within the network. The increase in bandwidth can actually result in increasing loss instead due to network constraints. The intercepting network device needs to detect this issue and react to ensure that the communicating end-stations achieve the desired application performance.

Existing access networks generally provide poor and unreliable quality. In general, the resulting performance is unreliable and quality is unpredictable. On the other hand, the backbone networks have been upgraded with high speed links and generally have sufficient capacity and the engineering is more reliable.

To avoid having to stay on the poor quality network to reach content, caching has been implemented pervasively. Caching is a solution to improve the performance by duplicating data at multiple locations such that the data is closer to the application, alleviating some of the network quality issues due to long hops.

However, not all content can be cached (e.g. real-time applications, user-generated content) and cost of caching may be prohibitive. Lastly the location of cache might still be too far away from the source therefore still resulting in poor performance.

There is a need to improve the performance of applications that cannot be cached or where caching is unaffordable or proximity is not achievable.

SUMMARY OF THE INVENTION

In accordance with one embodiment, a system is provided for improving the performance of an access network for coupling user devices to an application server. The system includes a user device and an intermediate server coupled via the access network. The user device has a processor adapted to encode data using a network performance enhancing coding (NPEC), and to transmit the encoded data via the access network to the intermediate server. The intermediate server is adapted to receive the encoded data and has a processor adapted to decode the encoded data using the NPEC, and to transmit the decoded data to the application server. In preferred implementations, the intermediate server is a proxy server, a traversal using relays-around-network-address-translator (TURN) server, or a virtual-private-network (VPN) servers. Any of these intermediate servers may be co-located with the application server.

The processor in the intermediate server is preferably further adapted to receive application data from the application server, encode the application data using the NPEC, and transmit the encoded application data to the user device, and the processor in the user device is preferably further adapted to decode the encoded application data using the NPEC.

BRIEF DESCRIPTION OF THE DRAWINGS

Embodiments of the present invention will now be described, by way of example only, with reference to the attached Figures, wherein.

DETAILED DESCRIPTION OF THE
ILLUSTRATED EMBODIMENTS

Although the invention will be described in connection with certain preferred embodiments, it will be understood that the invention is not limited to those particular embodiments. On the contrary, the invention is intended to cover all alternatives, modifications, and equivalent arrangements as may be included within the spirit and scope of the invention as defined by the appended claims.

Figure 1:
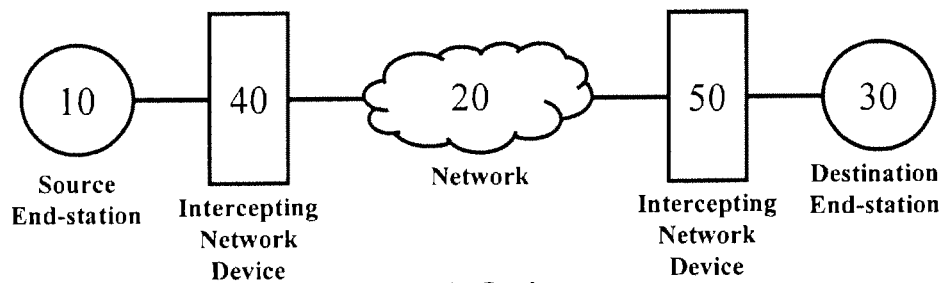
FIG. 1 is a block diagram of an environment in which the invention may be practiced.

FIG. 1 illustrates a network environment in which a source end-station 10 and a destination end-station 30 have applications which communicate using a standard protocol (generally, packet-based). This protocol is carried through a network 20 which can be, for example, the Internet or some other communications network. The end-stations 10 and 30 can be terminals, such as personal computers connected through a modem, local or wide-area networks, or other devices or systems having access to the network 20. For certain applications resident on the end stations 10 and 30, better network performance is required, and packets related to these applications are intercepted by network devices 40 and 50. Referred to as "intercepting" network device, the network devices 40 and 50 encode the standard packets using an encoding protocol to increase network performance. To illustrate how this network operates, standard packet flow is assumed from the source end-station 10 to the destination end-station 30 (i.e., left to right in FIG. 1). The intercepting network device 40 encodes the standard packets from the source end-station 10 and forwards the encoded packets to the intercepting network device 50 through the network 20. The intercepting network device 50 decodes the packets and forwards the reconstituted standard packet to the destination end-station 30. In the reverse direction, packets flowing from the destination end-station 30 to the source end-station 10 are encoded by the intercepting network device 50 and forwarded to the intercepting network device 40 over the network 20. The intercepting network device 40 decodes these packets, and the reconstituted standard packets are forwarded to the source end-station 10.

Figure 2:
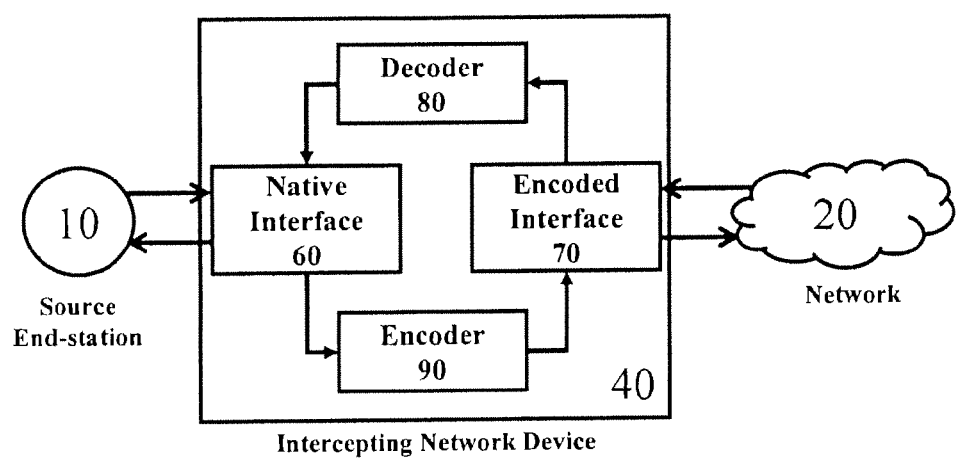
FIG. 2 is a block diagram illustrating the components in an intercepting network device used in FIG. 1.

FIG. 2 depicts an exemplary embodiment of the intercepting network device 40 that includes modules necessary to implement the encoding protocol to improve network performance. The modules can be resident in a single device, or can be distributed amongst several devices. In the illustrative embodiment of FIG. 2, the intercepting network device 40 includes a native interface 60, an encoded interface 70, a decoder 80, and an encoder 90. The native interface 60 sends and receives standard packets to and from the source end-station 10, and the encoded interface 70 sends and receives encoded packets to and from the network 20.

The encoder 80 receives standard packets from the native interface 60 and produces encoded packets by dividing the packet into one or more segments which then are ready for transmission to the network 20 by way of the encoded interface 70. The decoder 90 receives encoded packets from the encoded interface 70 and produces standard packets for transmission to the source end-station 10 by way of the native interface 60.

To assist in recreating the standard packets from the encoded packets, the encoder 90 may also create extra encoded packets. These extra encoded packets are derived from the standard packets and encoded packets. The extra encoded packets assist the decoder in the destination intercepting network device 50 to recreate or reassemble the original standard packets in the event one or more encoded packets are lost during their transmission through the network 20.

Figure 3:
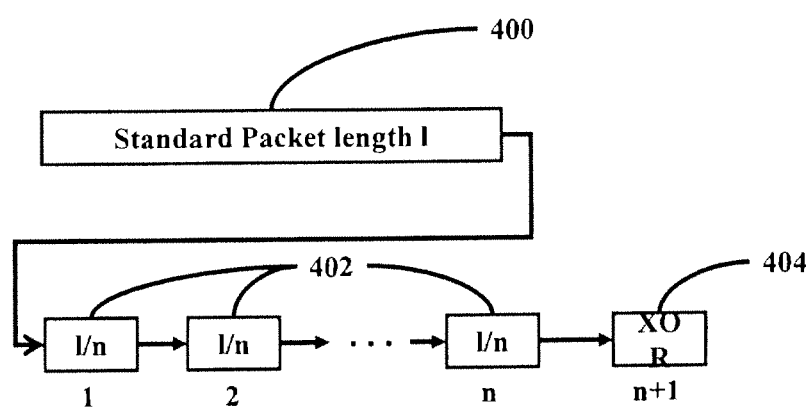
FIG. 3 illustrates an examplary segmentation and encoding of a standard packet.

The encoding of a standard packet according to one embodiment is illustrated in FIG. 3. To simplify the description, headers have been omitted from the original standard packet and the encoded packets. A standard packet 400 received at an encoder has a packet payload of 1 byte, and is segmented into n segments 402. Where n is chosen as an integer factor of 1, each of the n segments will have 1/n bytes, as shown. In addition, m extra encoded packets are created. In the example shown in FIG. 3, m=1 and the additional or extra segment 404 is a parity segment created by applying a logical function (e.g., XOR function) to all of the n segments.

Once the encoder has completed the process of creating the segments and the extra encoded segment, headers are added to the packets to create encoded packets and extra encoded packets. The headers use a standard protocol such that no proprietary operational functions are expected in the network. Therefore, the encoded and extra encoded packets are carried through the network to the decoding intercepting network element. The encoder can take into account the size of the packet and can increase n automatically to avoid transmitting an encoded packet of a size that would exceed the Maximum Transfer Unit (MTU) of the network when the standard protocol header is added to the encoded packet. This capability can also be useful for splitting jumbo frames prior to entering a network that cannot handle them.

As a decoder reassembles standard packets from the encoded and extra encoded packets, it can deal with loss of encoded packets. If enough information is contained in the extra encoded packets, missing segments caused by lost encoded packets can be recreated. If the loss is too great, the encoder has options. If the standard packet has a limited lifespan (such as a video packet), then the affected standard packet is discarded. If the application natively provides resiliency to packet loss, then again, the standard packet may be discarded. If the standard packet has a reasonable lifespan and the application does not provide resiliency natively, the decoder can request a retransmission of the missing segment from the encoder. This assumes that the encoder buffers the standard packet until it has been successfully decoded on the other end of the network.

To enable higher network performance for communicating applications, an encoding channel is established between intercepting network devices. Examples of how these channels are created are described in U.S. application Ser. No. 12/193,345. For the purpose of this application, an encoded channel between the intercepting network devices 40 ad 50 is assumed to be successfully negotiated. The encoded channel is used to carry both data and control information, and encoded packets and extra encoded packets can now be sent and received between the intercepting network devices.

Applications residing on end-stations in the network above can tolerate different levels of lost packets within the communication network. The intercepting network devices can differentiate these applications based upon standard protocol signaling elements. File transfers using FTP are signaled using a TCP port. This will open TCP ports in the 64000 range to transport the files between the end-stations. TCP is resilient to loss and variation of latency within the network. The key goal of the transfer is to ensure that the file arrives intact and in as timely a manner as the network will allow. This application is in contrast to a video conference application. These can be signaled using the Session Initiation Protocol on UDP port 5060 and contains the information for the video, voice and data sessions associated with the conference. Video sessions have a low tolerance to loss; the loss of an eye frame (a complete picture of the screen) can greatly disrupt video compression algorithms. The greater the bandwidth required for a video stream, the lower the tolerance for loss since each standard packet is carrying more information related to the video stream. Voice sessions are relatively more tolerant to loss due to the predictive nature of human speech. Voice codecs are able to fill in gaps to ensure a continuous voice stream. In either case, video and voice sessions need to have less than 1% standard packet loss to avoid video blocking or voice clipping, and most providers attempt to keep standard packet loss at less than 0.5%.

Within the context on a given session, the different streams can be treated with different loss objectives. Deep Packet Inspection (DPI) can be used in the intercepting network devices to detect the type of application (video/voice/data) and set the loss objectives according to a configured network policy for that type of application. Ultimately each standard packet can have its own loss objective based on information provided in the header that identifies the level of protection required (e.g., SVC—scalable video codec). This loss objective is defined as the Target Loss Ratio (TLR).

The TLR can be used to determine the encoding rate which is determined by both n and m. The encoding rate can be adjusted based on observed and/or reported network performance for one or all encoded channels terminating at an encoding component associated with a given intercepting network device. The goal is to set the encoding level such that the encoded channel achieves the TLR for the session or better.

Figure 4:
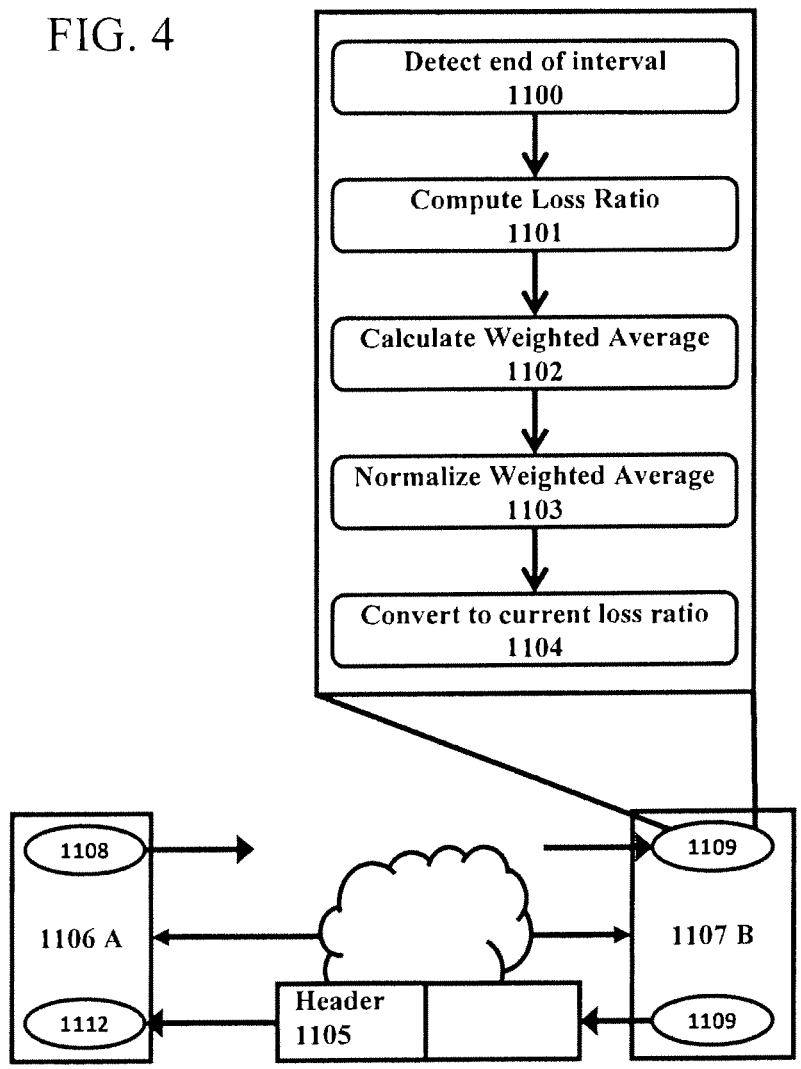
FIG. 4 illustrates a first example algorithm to evaluate loss.

Referring to FIG. 4, the determination of the loss ratio observed is described in relation to the encoded channel between intercepting network device A 1106 and intercepting network device B 1107, more specifically looking at the channel in the direction from intercepting network device A to intercepting network device B. Under a "no loss", or acceptable loss, condition, the encoding can be set to n=1 and m=0 to avoid using extra bandwidth in the network when it is not necessary. The decoder 1109 of the intercepting network device B 1107 counts the number of packets received $P_x$ and the number of packets lost $LP_x$ over an interval of W units of time (for example W=8 seconds) using the subroutine illustrated in FIG. 4. The interval period can also be defined as the reception of a particular number of packets. Alternatively, $LP_x$ can represent the number of retransmission requests, such that the successfully recovered loss is not counted as part of the loss ratio. The end of each interval is detected at step 1100, and the loss ratio $L_x$ is calculated at step 1101 using, for example, the following ratio:

$$L_x = \frac{LP_x}{(LP_x + P_x)} \quad (1)$$

$P_x$ in equation 1 can be the number of standard packets transmitted over the time period W. In this case, $LP_x$ is the number of lost standard packets. This is referred to the $SPL_x$. Another option for $P_x$ is to count the number of encoded segments and extra encoded segments which should have arrived at the decoder to re-assemble the standard packets over the time period W. $LP_x$ then is the number of segments and extra segments which were lost in the network over the time period W. This is referred to the $EPL_x$. In general, $SPL_x$ is lower than $EPL_x$ due to the fact that the encoding scheme helps the decoder recover from loss, allowing standard packets to be reproduced even though encoded packets related to the standard packet were lost. From that perspective, $EPL_x$ is a truer indication of the performance of the network.

The current loss ratio ($L_x$) can refer to loss calculated from measurement of standard packets ($SPL_x$). It can refer to current loss calculated from encoded and extra encoded segments ($EPL_x$). It can also refer to a current loss ratio calculated from the combination of SPLx and EPLx. One example of this combination is:

$$CLR_x = \frac{\omega_S SPL_x + \omega_E EPL_x}{\omega_S + \omega_E} \quad (2)$$

where $\omega_S$ is the weight given to the loss of standard packets and $\omega_E$ is the weight given to the loss of encoded segments.

To avoid reacting to random events, step 1102 computes an average loss over the last z loss measurements. In order to take into account the most recent network status, a weighted average can be performed to weight the most recent current loss ratio measurements, e.g., using the equation:

$$WL_x = \frac{\sum_{i(z-x)\cdot z} \langle CLR_i \times \omega_i \rangle}{\sum_{i=1\cdot z} \omega_i} \quad (3)$$

where $WL_x$ represents the weighted average of the most recent loss measurements for interval x. The weights are such that $\omega_i < \omega_j$ for $i < j <= x$.

To avoid keeping track of many loss measurements, the previous weighted loss can also be used to evaluate the new weighted loss, e.g., using the equation:

$$WL_x = \frac{\langle WL_{x-1} \times \omega_{old} \rangle + \langle CLR_x \times \omega_{new} \rangle}{\omega_{old} + \omega_{new}} \quad (4)$$

where $\omega_{old}$ and $\omega_{new}$ are weights that are set in general such that $\omega_{old} < \omega_{new}$.

Optionally the weighted loss ratio can be normalized at step 1103 to simplify the lookup using integers only. The normalized loss $NL_x$ can be computed using the following equation:

$$NL_x = \frac{N \times WL_x}{P_x} \quad (5)$$

where N is the normalization factor (e.g., N=10000).

$NL_x$ is then used to index an encoding level table at step 1104 to extract the current encoding level. An example of an encoding level table is shown below, providing 8 levels, where INT_max represents the largest integer or a large value (e.g., 10000).

| $NL_x$ min | $NL_x$ max | Encoding Level |
|---|---|---|
| 0 | 0 | 0 |
| 1 | 75 | 1 |
| 75 | 145 | 2 |
| 146 | 185 | 3 |
| 186 | 210 | 4 |
| 211 | 260 | 5 |
| 261 | 370 | 6 |
| 371 | INT_max | 7 |

The encoder 1111 of the intercepting network device B 1107 then inserts the extracted encoding level 1105 in the header of each encoded packet sent for that session to the intercepting network device A 1106. The decoder 1112 in the intercepting network device A 1106 reads the encoding level from the received packets. It then indexes a new parameter table with the encoding level to obtain the value of I and Max_n, which represents the largest value to which n should be set given the current encoding level. Multiple new parameter tables can be used to achieve different TLRs based on the application requirements and acceptable overhead. An example of such a new parameter table using 8 loss ratios is shown below:

| Encoding Level | Max_n | m |
|---|---|---|
| 0 | INT_max | 0 |
| 1 | INT_max | 1 |
| 2 | INT_max | 1 |
| 3 | 3 | 1 |
| 4 | 2 | 1 |
| 5 | 2 | 1 |
| 6 | 1 | 1 |
| 7 | 1 | 1 | where INT_max represents the largest integer (infinity).

Before the encoder 1108 of the intercepting network device A 1106 encodes a packet of size s, it indexes a preconfigured packet size table with s, to obtain Rec_n, which represents the recommended value of n given the packet size. An example packet size table is show below:

| Packet Size (bytes) | Rec_n |
|---|---|
| <88 | 1 |
| 89 to 264 | 2 |
| 265 to 528 | 3 |
| >528 | 4 |

Using this table, a packet of size s<88 bytes returns Rec_n=1. If s>528 bytes, then Rec_n=4. The value of n used to encode the packet is then determined as n=min(Rec_n, Max_n).

In another embodiment, the decoder 1109 calculates the weighted loss ratio $WL_x$ using equation (3) or (4) above. It can optionally normalize to compute $NL_x$ using equation (5). The exact loss value ($WL_x$ or $NL_x$) is sent at regular intervals (e.g., every second) to the decoder 1112 in a control message that is inserted in the encoded channel for the session. The decoder 1112 extracts the exact loss values from the control messages. The encoder 1108 uses the exact loss value to index a new parameter table to obtain Max_n and m.

| $NL_x$ min | $NL_x$ max | Max_n | m |
|---|---|---|---|
| 0 | 0 | INT_max | 0 |
| 1 | 75 | INT_max | 1 |
| 76 | 145 | INT_max | 1 |
| 146 | 185 | 3 | 1 |
| 186 | 210 | 2 | 1 |
| 211 | 260 | 2 | 1 |
| 261 | 370 | 1 | 1 |
| 371 | 10000 | 1 | 1 |

The value of n is derived as n=min(Rec_n, Max_n). Multiple new parameter tables can be configured to reflect different Target Loss Ratios, and the encoder 1108 uses the appropriate table based on the Target Loss Ratios of the application. Sending the actual loss ratio, instead of the current loss ratio, allows configuration the parameter tables at the encoding side, thus simplifying the configurations.

The previous equations demonstrate how the loss ratio is calculated for individual streams. Using FIG. 5 as an example, an intercepting network device D 1203 calculates the loss ratios of three flows 1204, 1205 and 1206 originating from intercepting network devices A 1202, B 1207 and C 1208, respectively. In addition to returning the loss ratio measured for the flow, the receiving intercepting network device can compute the average of the weighted loss ratio $AL_x$ from the three flows that are sent to it over an interval period x.

The interval period can be the same as the interval period used for calculating the loss ratio for a single flow. The average loss ratio can be calculated, for example, as:

$$AL_x = \frac{\sum_{i=1...f} WL_i}{f} \quad (6)$$

where $WL_i$ can be calculated using equation (3) or (4) above. The $AL_x$ can then be normalized using equation (5) above to create a normalized average loss ratio, $NAL_x$. The $NAL_x$ is then indexed in an encoding level table to obtain an average loss ratio at the far end ($ALFE_x$). The encoding level table can be the same as illustrated above or preconfigured with different numbers. The $ALFN_x$ is added to the packet header of the encoded packets transmitted by the decoder of the intercepting network device D 1203 to the respective intercepting network devices 1202, 1207 and 1208 along with the per flow current loss ratio computed as described above.

If the aggregate information is included in the packet header, the intercepting network device 1202, 1207 or 1208 can use the information to decide whether to change its encoding level. The decoder of the intercepting network device A 1202 also calculates the average loss at the near end ($ALNE_x$) which is the average of the current loss ratio received in the encoding channel from the g encoded sessions 1211, 1212 and 1204 active during a measurement period x, $$ALNE_x = \frac{\sum_{i=1 \cdot g} \text{Current Loss Ratio}}{g} \quad (7)$$

Figure 5:
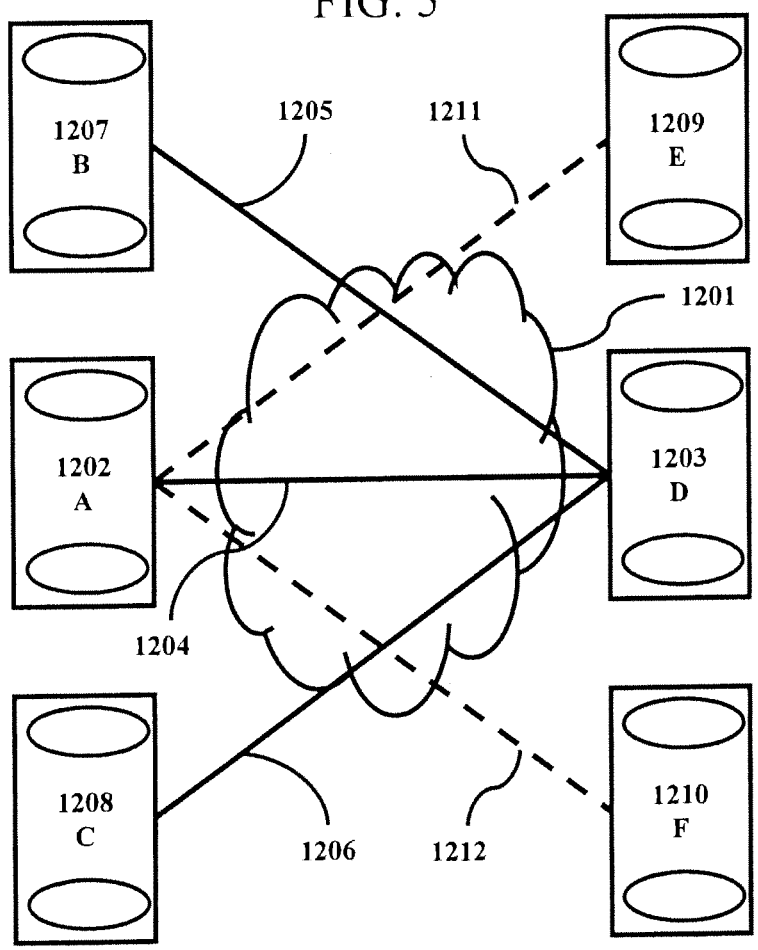
FIG. 5 illustrates an example embodiment considering average loss.

In the example of FIG. 5, the $ALNE_x$ calculated at the intercepting network device A 1202 represents the average of the current loss ratio received from intercepting network devices D 1203, E 1209 and F 1210.

If the difference between the current loss ratio for the session and the $ALFE_x$ is below a predetermined threshold, the current loss ratio is used to set the encoding level, as described above. In this case, it is assumed that it is unlikely that the sessions are congesting the upstream network since the current loss ratio is better, or slightly worse than, the computed $ALFE_x$.

If the difference between the current loss ratio and the $ALFE_x$ is greater or equal to a predetermined threshold AND the current loss ratio minus the $ALNE_x$ is greater than or equal to a predetermined threshold, then the current loss ratio is ignored, and the encoding levels are set according to the packet size table only to minimize bandwidth usage by choosing the most bandwidth-efficient encoding method for the given packet. The predetermined thresholds could be different and set according to network policies and topology.

Irrespective of how n is determined (current loss or average loss), the increase in the value of n can be performed gradually to avoid a big step in the increase of overhead. When a higher value of n is recommended by the table, it can be applied to only a subset of the subsequent standard packets: only v standard packets out of the next incoming w standard packets use the increased value of n, while the other w-v packets use the previous lower value for n. The values of v and w can also change if the measured loss ratio continues to increase or as the measured loss ratio approaches the next level.

For example, if the measured loss (weighted or normalized) is 0%, then n=1, m=0 and v=w=1. Therefore all packets are encoded with n=1, m=0. If the measured loss increase to greater than 0% but lower than 0.05%, then n=4, m=1, but v=1 and w=3, such that only one out of three packets is encoded with n=4, while the others use the previous encoding level n=1, m=0. When the measured loss exceeds 0.05% but is below 0.1%, then change to v=1 and w=2, such that every second packet is encoded with n=4, while the others use the previous encoding level n=1, m=0. When the measured loss exceeds 0.1% but is below or equal to 0.2%, then use v=1 and w=1, such that every packet is encoded with n=4. Different values of v and w can be configured to smooth out the overhead increase at different predetermined loss ratios. This capability can significantly smooth out the transfer function between different loss ratios.

Intercepting network devices operate on the theory that network loss will decrease as the encoding level is increased. However, as n and/or m are increased, the number of packets generated by the intercepting network devices and, traversing the network, is increased. This results in an increase in the bandwidth required to achieve application communication.

The additional bandwidth may in some circumstances lead to an increase in loss. If one or more links in the path are bandwidth constrained, the additional packets actually increase congestion at this point. When a packet arrives at a link for transmission, it may or may not be able to be transmitted immediately. If the packet cannot be sent, most devices implement a queue to buffer the packet so that it can be transmitted later. In some devices, as the queues associated with this link grow to a particular level, a network congestion control mechanism (e.g., RED, WRED, etc.) may be invoked to handle the congestion on this link. As the number of packets arriving at this link is increased, the likelihood of one of the encoded packets being discarded is increased. The probability is also increased due to the additional overhead added by the encoding channel. The additional overhead increases the depth of the queue more quickly thus increasing the likelihood that a packet will be discarded.

Another cause of congestion can be switching context. A network device in the path between the source end-station and the destination end-station may only be able to forward a limited number of packets per period of time. Therefore, even though enough link bandwidth is available to transport the encoded packets, the network device cannot forward all the frames, leading to loss.

Therefore, by increasing the encoding level which increases the number of packets in the path and the amount of overhead, the loss ratio may increase. The intercepting network device requires an algorithm to react to this situation. First, the intercepting device needs to detect a significant increase in loss ratio on an encoding channel. This can be done, for example, by tracking the results of the loss ratio over a period of time. This can be the current loss ratio as calculated by equation (1) or (2), the weighted loss ratio calculated by equation (3) or (4), the normalized loss ratio calculated by equation(5), or any other method to obtain loss.

One method of detecting a significant increase is to use the instantaneous change in the loss ratio. This looks at the difference between the current loss ratio and the previous loss ratio'.

$$\Delta CLR_x = CLR_x - CLR_{x-1} \quad (8)$$

If this difference exceeds a significant increase threshold, defined as SIT, then a significant increase in loss ratio is detected. To avoid spuriously declaring that a significant increase has occurred, the number of encoded packets sent between the source intercepting network device and the destination intercepting network device must be statistically relevant. This is captured in the case equation below:

$$\text{significant increase} = \begin{cases} \text{true if packets} \geq \text{minimum relevant} \\ \text{and } \Delta CLR_x \geq SIT \\ \text{false if packets} < \text{minimum relevant} \end{cases} \quad (9)$$

Instead of using an instantaneous ratio, the previous equations can use the average loss ratio (like equations (3) and (4)). The change can be calculated using equation (10):

$$\Delta WL_x = WL_x - WL_{x-1} \quad (10)$$

Then the significant increase can be determined as follows:

$$\text{significant increase} = \begin{cases} \text{true} & \text{if } \Delta WL_x \geq SIT \\ \text{false} & \text{if } \Delta WL_x < SIT \end{cases} \quad (11)$$

Another approach is to record the loss ratio when an increase is the encoding level is enacted. The change in loss ratio ($CLR_{original}$) is recorded and used as the basis of comparison to the current instantaneous loss ratio. If the current loss ratio is, for example, ten times the original loss ratio, a significant increase in loss has been detected:

$$\text{significant increase} = \begin{cases} \text{true} & \text{if } CLR_x \geq 10 \times CLR_{original} \\ \text{false} & \text{if } CLR_x < 10 \times CLR_{original} \end{cases} \quad (12)$$

Figure 6:
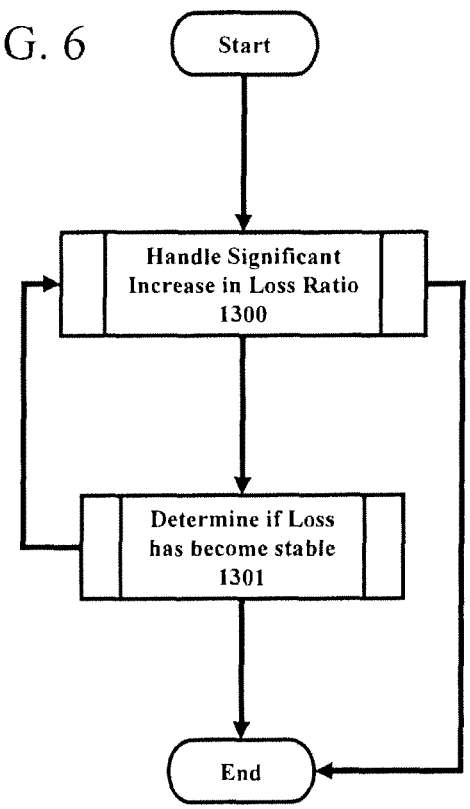
FIG. 6 illustrates an example of encoding level back-off.

Once a significant increase in the loss ratio has been detected, the intercepting network device reacts using an encoding level back-off scheme. In this case, the intercepting network device reacts to loss by decreasing the encoding level instead of increasing it. FIG. 6 is a flow chart of one technique for decreasing the encoding level in response to the detection of a significant increase in the loss ratio. First, step 1300 attempts to find an encoding level that stops the increase in loss ratio. Once this level is achieved, step 1301 ensures that the loss ratio is stable before returning the intercepting network device to normal processing of loss ratio.

Figure 7:
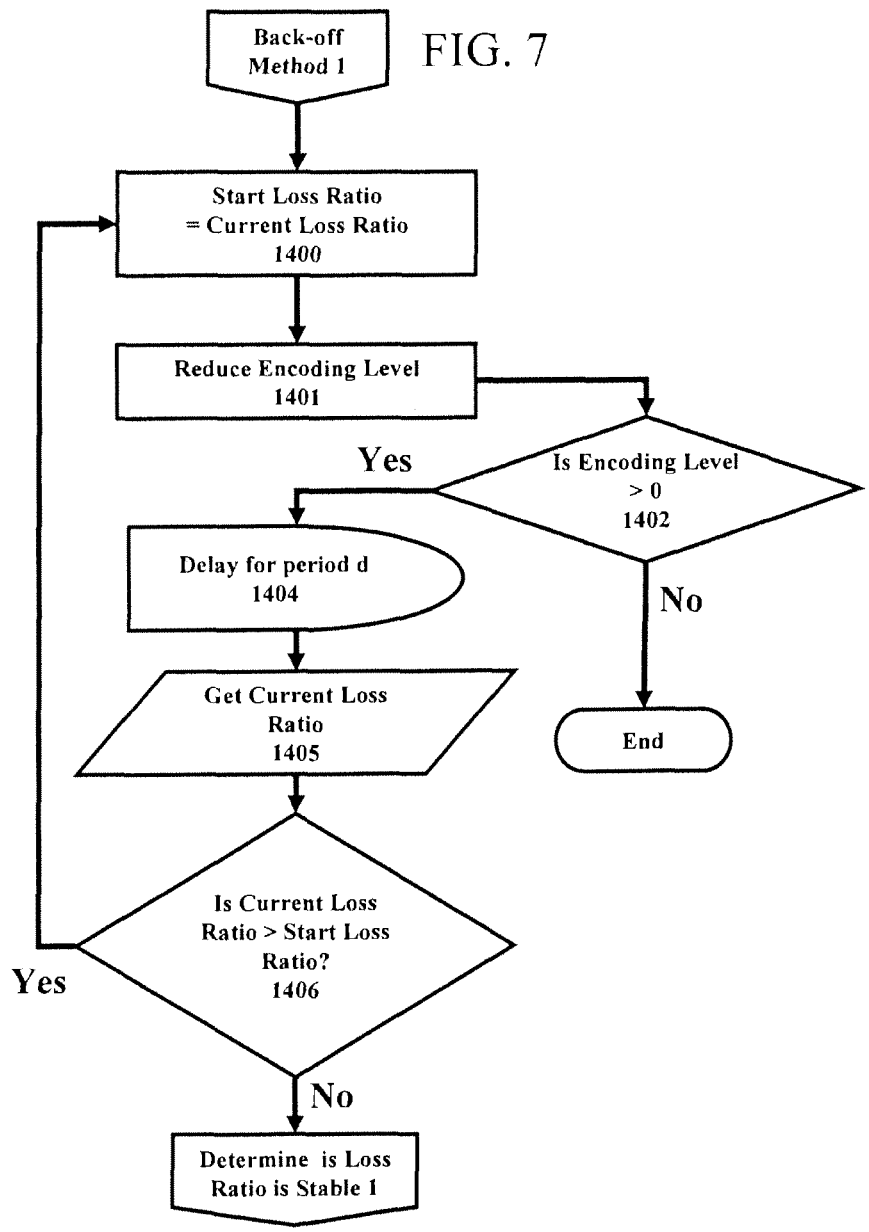
FIG. 7 is a flow chart illustrating the steps executed when a significant increase in loss is detected and encoding level back-off is enabled.

FIG. 7 depicts one implementation of step 1300 in FIG. 6. This algorithm defines the steps to find an encoding level that stops the increase in loss ratio. The algorithm starts by recording the current loss ratio at step 1400, and then the encoding level of the channel is reduced at step 1401. The reduction of the encoding level can be effected in several ways. For example, the encoding level can be reduced linearly for each iteration of the algorithm, or it can be decreased exponentially. One implementation supports both methods and allows one of the methods to be selected when the encoding channel is established. Another example uses a configuration policy that is set before the encoding channel is created.

Once the encoding level has been reduced at step 1401, step 1402 determines whether the encoding level is greater than zero. A negative answer at step 1402 indicates that the current loss ratio is still higher than the starting loss ratio, which indicates that the encoding back-off algorithm is not working, and thus the algorithm is terminated at step 1403. The encoding channel then returns to normal loss ratio processing or reverts to n=1 and m=0 and notifies the user and/or the system.

If the answer at step 1402 is affirmative, the system advances to step 1404 where the intercepting network device waits for a period of time d before sampling the current loss ratio again at step 1405. Step 1406 then determines whether the current loss ratio is greater than the starting loss ratio at step 1406, i.e., the loss ratio is still increasing by some predetermined amount, the algorithm returns from step 1406 to steps 1401 and 1402 to reduce the encoding level for the channel again. If the answer at step 1406 is negative, the system proceeds to step 1407 to determine if the current encoding level results in a stable loss ratio.

Figure 8:
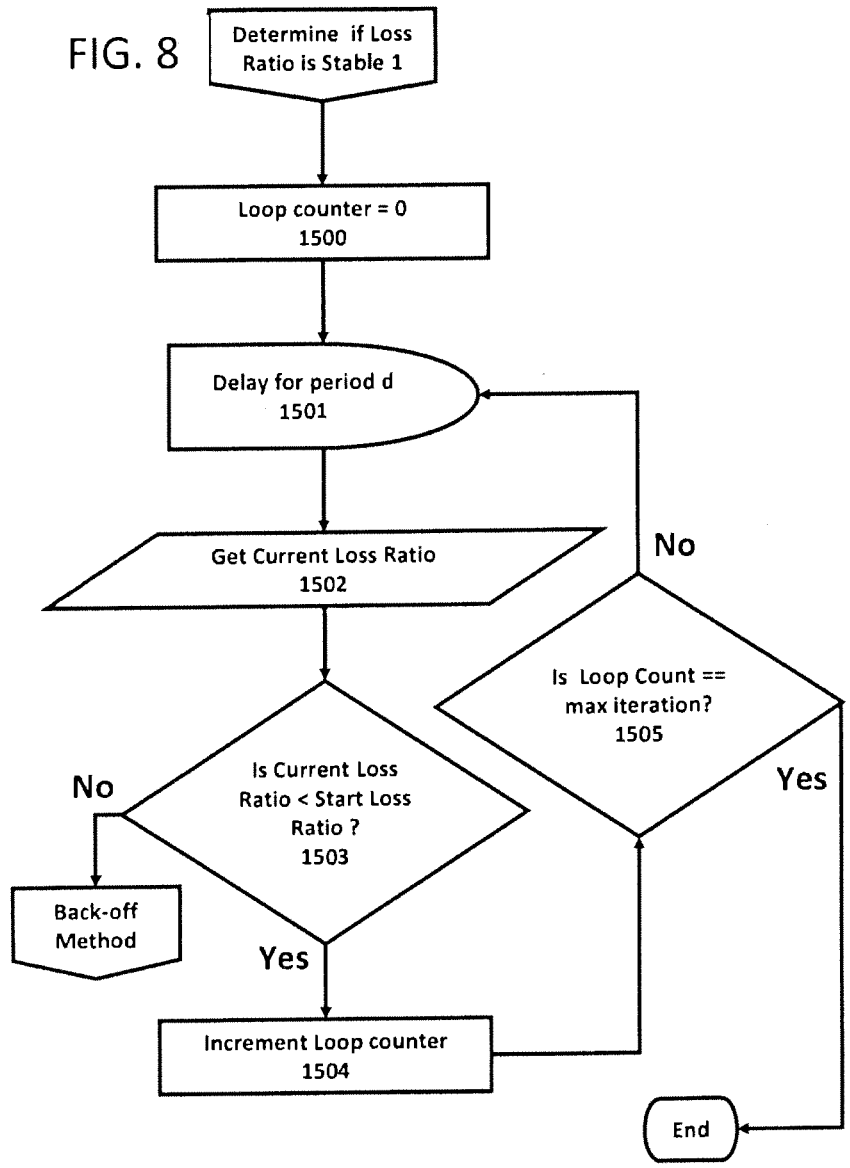
FIG. 8 is a flow chart illustrating the steps executed to detect loss ratio stabilization after encoding level back-off is enabled.

FIG. 8 depicts one implementation of step 1301 in FIG. 6. This algorithm defines the steps to determine if the current encoding level has resulted in a stable loss ratio. The algorithm runs in a loop which is initialized in step 1500. The intercepting network device then waits for a period d at step 1501 before sampling the current loss ratio again at step 1502. If the current loss ratio is significantly greater than the start loss ratio, the algorithm exits and returns to backing off the encoding level at step 1503. Step 1503 determines whether the current loss ratio remains below the starting loss ratio (step 1503), then the algorithm increments the loop counter (step 1504) and continues to sample the current loss ratio until the maximum number of iterations has been reached (step 1505). At this point, the algorithm exits since the significant increase in loss ratio has been handled.

Figure 9:
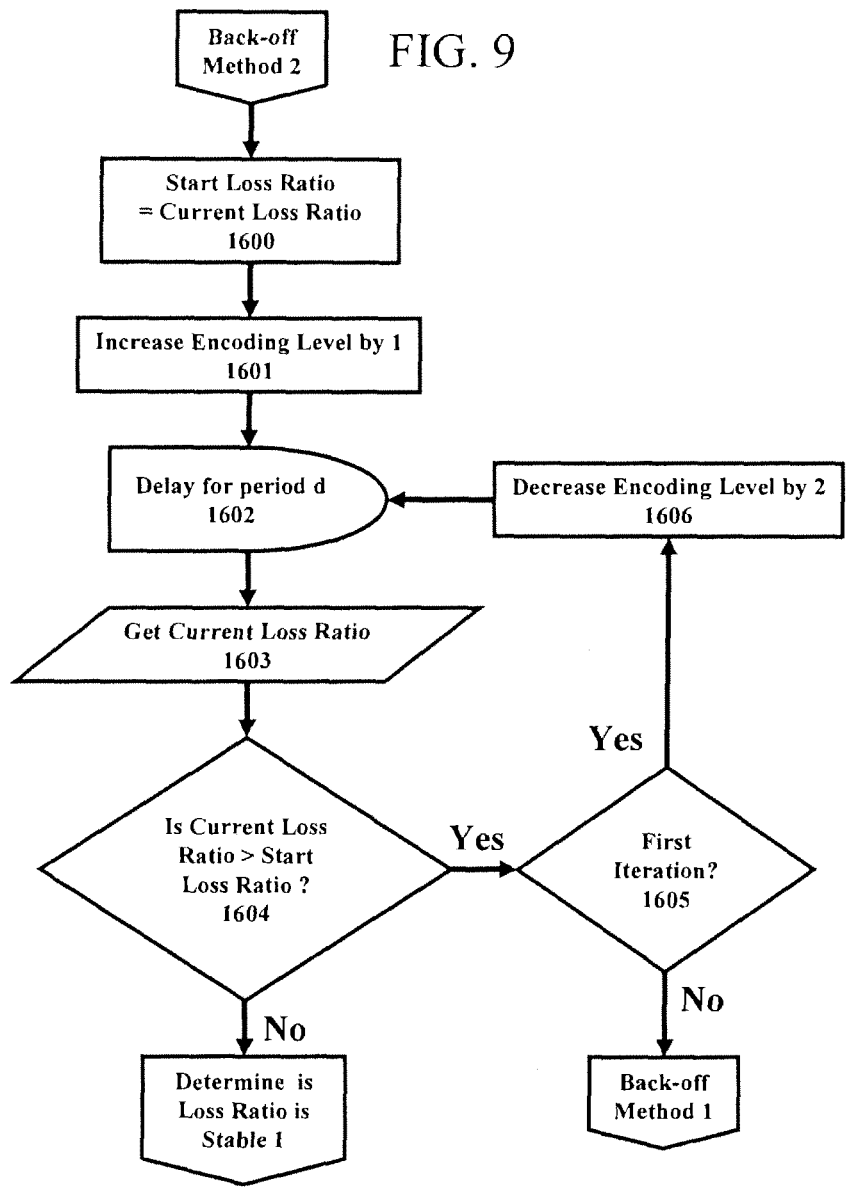
FIG. 9 is a flow chart illustrating an alternate algorithm which is executed when a significant increase in loss is detected and encoding level back-off is enabled.

There are other implementations of the algorithm of FIG. 6. For example, FIG. 9 depicts an alternate implementation of the encoding level back-off scheme. In this case, the algorithm sets the starting loss ratio to the current loss ratio value at step 1600, and then step 1601 initially increases the encoding level to determine whether the loss ratio will be reduced. If step 1604 detects a reduction in the loss ratio, the algorithm exits and proceeds to ensure that the loss ratio is stable before returning to normal loss ratio processing. If step 1604 does not detect a reduction in the loss ratio, the algorithm proceeds to steps 1605 and 1606 to reduce the encoding level by 2 levels, and then to step 1602 to wait for a period before checking the current loss ratio again. If this succeeds (steps 1603 and 1604), again the algorithm ensures that the loss ratio is stable before returning to normal loss ratio processing. If step 1604 determines that the current loss ratio is still greater than the starting loss ratio and step 1605 determines this is not the first iteration, then the algorithm continues backing off the encoding level using the algorithm of FIG. 7.

Figure 10:
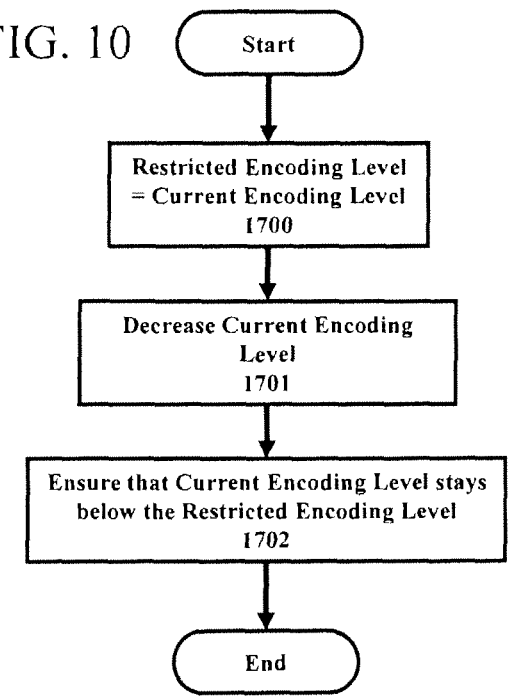
FIG. 10 is a flow chart of an example of restricting an encoding level due to burst loss.

Another approach to handling a significant increase in loss ratio (in step 1300 of FIG. 6) is to restrict the encoding level that is causing the significant increase, using the algorithm of FIG. 10. In step 1700, the current encoding level is recorded as the restricted encoding level, and then the current encoding level is reduced at step 1701. Then step 1702 ensures that the current encoding level remains below the restricted encoding level.

Figure 11:
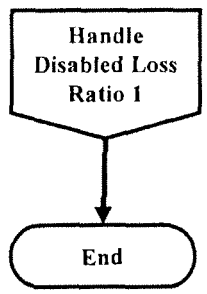
FIG. 11 is a flow chart of an example of handling a restricted encoding level for the remaining time the encoding channel remains open.
Figure 12:
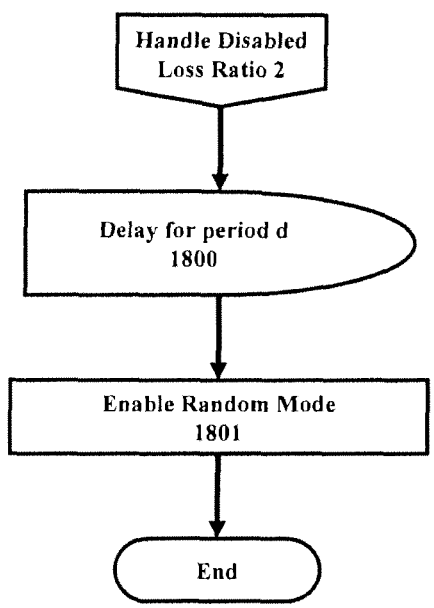
FIG. 12 is a flow chart of an example of handling a restricted encoding level for a period of time d.
Figure 13:
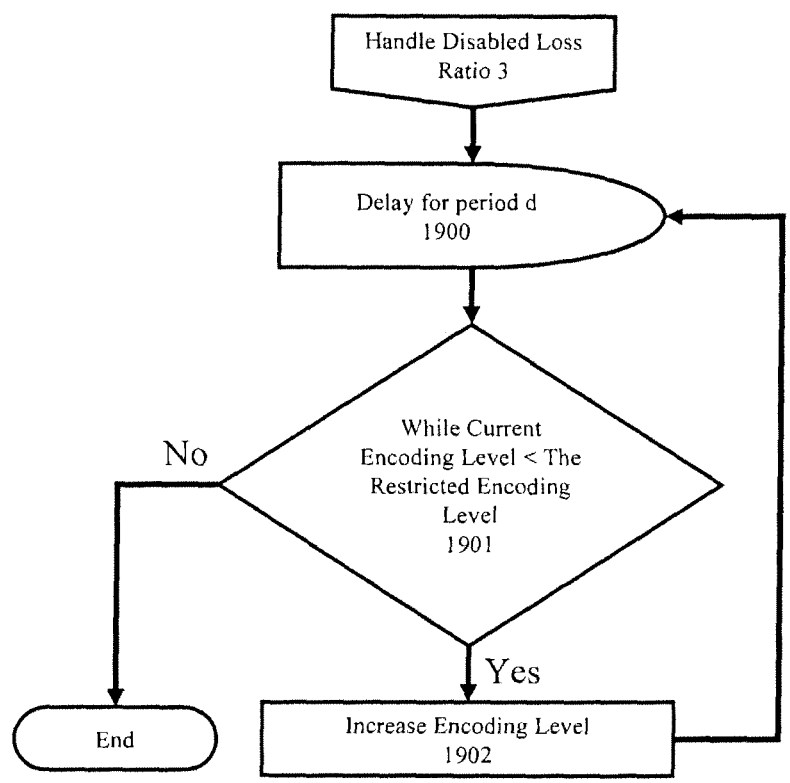
FIG. 13 is a flow chart of an example of handling a restricted encoding level. In this case, the encoding level is increase over a period of time to match the restricted encoding level.

There are a number of ways to determine whether the restriction of the encoding level stabilizes the loss ratio, in step 1301 of FIG. 6. One way depicted in FIG. 11 is to simply exit the algorithm so that the encoding level is never used again while the encoding channel is active. FIG. 12 depicts an alternative technique that delays for a period of time d at step 1800 before re-enabling the encoding level for the encoding channel at step 1801. FIG. 13 depicts another alternative in which the encoding level is slowly adjusted back to the restricted encoding level. The period of time over which this occurs depends upon the delay period d set in step 1900, and the increment used to increase the encoding level in step 1902. Step 1901 compares the current encoding level with the restricted encoding level to determine whether the current encoding level is less than the restricted coding level. As long as the answer is affirmative, the system advances to stop 1902 to increases the coding level. Once the restricted level is achieved, the algorithm exits at step 1903.

Figure 14:
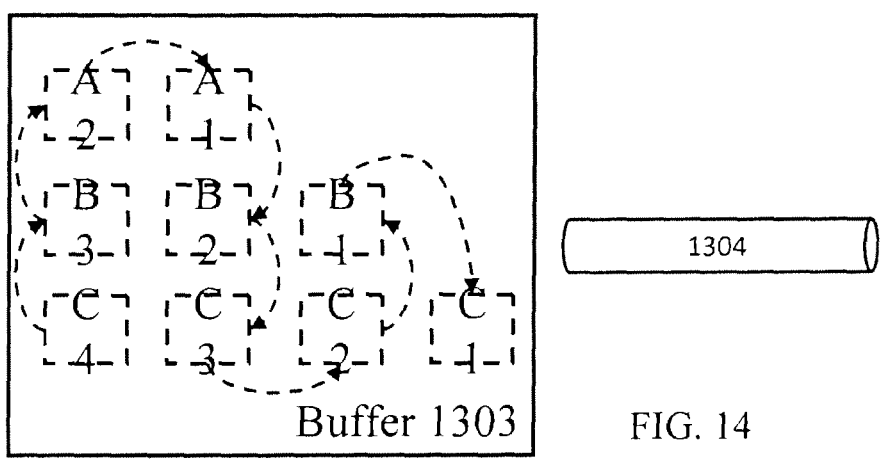
FIG. 14 is a flow chart of an example of interleaved mode according to an embodiment of the present invention.

Another strategy for handling a high level of network loss is to configure the encoder to transmit encoded packets in an interleaved manner (referred to as "interleaved mode"), thereby spreading the risk of losing multiple encoded packets across different standard packets and providing a higher probability of encoded packet re-assembly. Thus, instead of sequentially sending groups of encoded packets such that each group corresponds to a single standard packet, encoded packets from different standard packets are interleaved with one another. FIG. 14 illustrates an example of the interleaving mode. In this example, it is assumed that standard packets A, B, and C are respectively segmented into encoded packets A1, A2; B1, B2, B3; and C1, C2, C3 and C4. Encoded packets A2, B3 and C4 are extra encoded packets. Instead of sending these encoded packets grouped according to their respective standard packets, they are interleaved by groups of k standard packets. In the example of FIG. 14, k=3. The encoder stores the encoded packets corresponding to k standard packets into a buffer 1303. Alternatively, the encoder stores a number of packets that arrive during a predetermined time period or until a packet with time sensitive information is detected (e.g., via deep packet inspection). To avoid reordering, the set of encoded packets is aligned to the left such that the last second data of each standard packet is at the tail and is sent last, and the first encoded packet of each standard packet is at the head and is transmitted first. The encoder transmits on the physical interface 1304 the data units at the head in order of top to bottom, or any order that minimizes sending two consecutive encoded packets from the same standard packet. In the example of FIG. 14, the encoded packets can be sent in the order C1, B1, C2, A1, B2, C3, A2, B3, and C4. Sending all the extra encoded packets last can minimize delay. The interleaving can also be done randomly. The group of packets to interleave can include all the encoded packets transmitted from the interface, or the interleaving group can include encoded packets of the same application (e.g., same channels of a video conference), the same destination or a preconfigured grouping.

Figure 15:
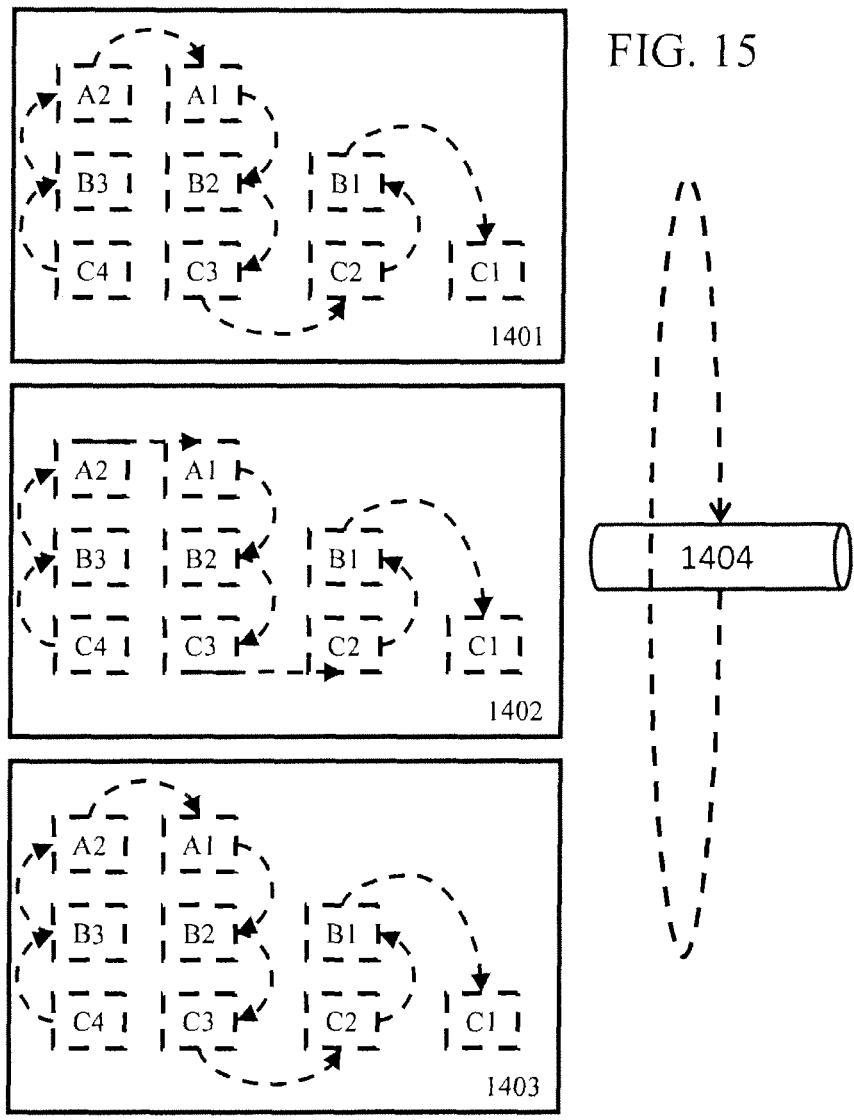
FIG. 15 is a flow chart of an example of multi-level interleaved mode according to an embodiment of the present invention.

In FIG. 15, another level of interleaving is achieved, by interleaving the encoded packets of different interleaved groups 1401, 1402, 1403 of interleaved encoded packets. By such interleaving, the impact of any large loss of data units can be minimized, and, depending on the coding and strategy employed, this type of loss may be recoverable.

Figure 16:
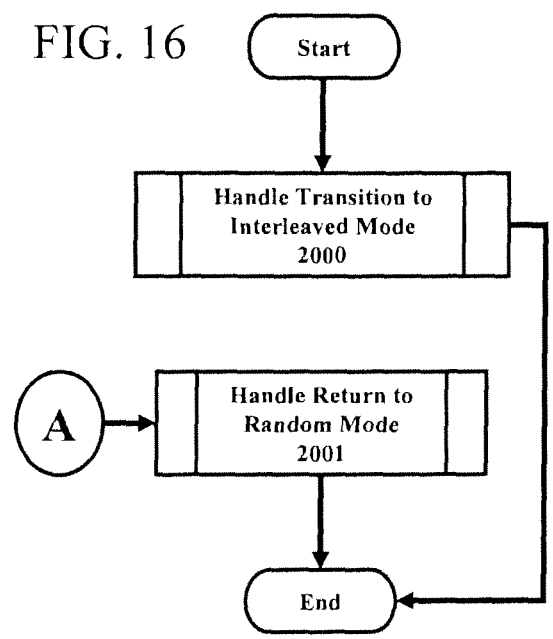
FIG. 16 is a flow chart illustrating the steps executed when the intercepting network device is handling burst loss.

The "interleaved mode" can also be used to address burst loss. Burst loss can be detected if the current loss ratio (i.e., the result of equation (1), (2), (3) or (4)) exceeds the Target Loss Ratio by a predetermined amount (e.g., double). One technique for handling burst loss is illustrated in FIG. 16. When burst loss is initially detected, the loss ratio is debounced. Assuming that the burst loss persists, then a transition to the interleaved mode is executed at step 2000. If the interleaved mode is enabled, the conditions to return to the random mode are checked and verified at step 2001.

Figure 17:
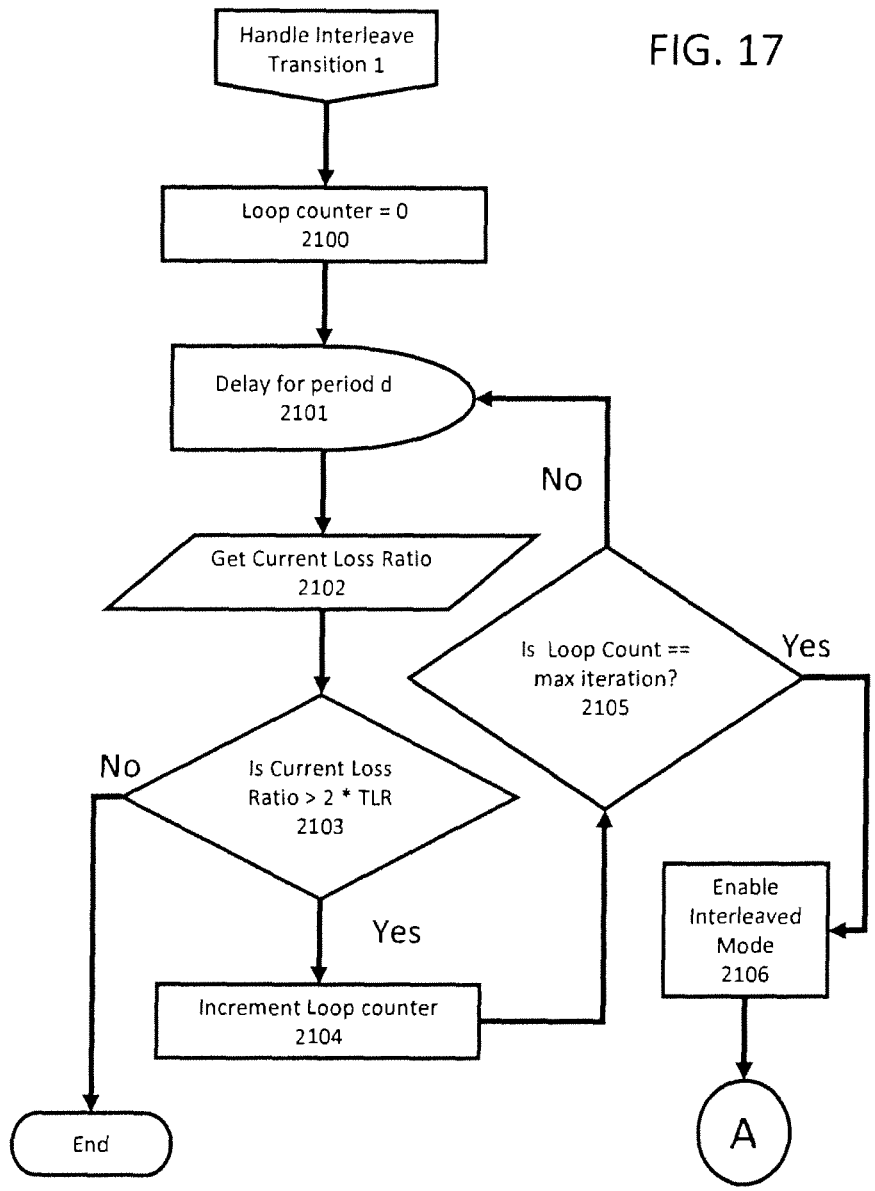
FIG. 17 is a flow chart illustrating the steps executed when the intercepting network device is handling burst loss and interleaved mode is enabled.

An example of how to transition to the interleaved mode is illustrated in FIG. 17. This algorithm debounces the current loss ratio to ensure that the issue persists before enabling interleaved mode. The implementation uses a loop that is initialized at step 2100 and then delays for a time period of d at step 2101. The current loss ratio is retrieved at step 2102 and checked at step 2103 to determine whether the current loss ratio exceeds twice the Target Loss Ratio, which is acceptable for this standard protocol type. An affirmative answer at step 2103 causes the loop counter to be incremented at step 2104, and then step 2105 determines whether the loop count has reached the maximum iteration. If the answer is negative, the system returns to step 2101 and repeats steps 2102 and 2103. A negative answer at step 2103 ends the routine, and an affirmative answer at step 2105 causes the interleaved mode to be enabled at step 2106.

Thus, assuming that the loss ratio is maintained for delay period d times the max iterations, the queuing is set to the interleaving mode, and the algorithm continues on to handle the return to the random mode. If the loss ratio does not continue to exceed twice the TLR for the application, the algorithm exits and the interleaved mode is disabled.

Returning to the random mode can be implemented by any of several different methods illustrated in FIGS. 18-21. The method actually used for an encoding channel can be selected in several ways. The intercepting network device may be configured with the method to use for all encoding channels. Also, the intercepting network device may have a policy that matches the standard protocol being encoded. Alternatively, the intercepting network devices may negotiate the method to be used when the encoding channel is established.

Figure 18:
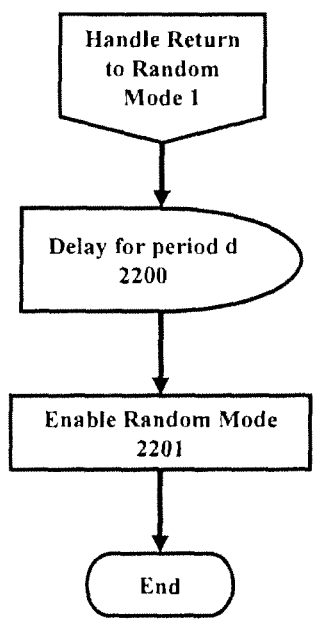
FIG. 18 is a flow chart illustrating the steps executed when the intercepting network device is leaving interleaved mode and random mode is enabled.

FIG. 18 illustrates the most straightforward method for returning to the random mode. In this case, a timer is started at step 2200 when the encoded channel has entered the interleaved mode. When the timer expires, the channel returns to the random mode at step 2201.

Figure 19:
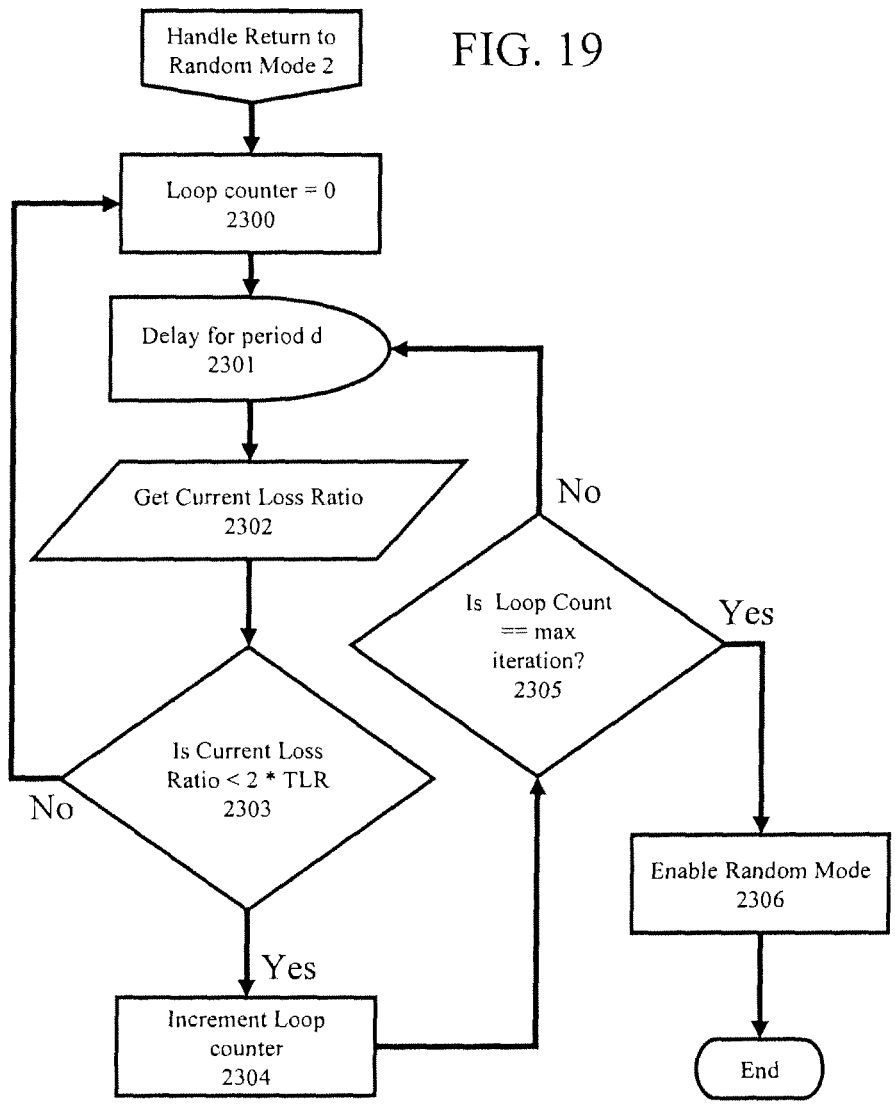
FIG. 19 is a flow chart illustrating an alternate algorithm which is executed when the intercepting network device is leaving interleaved mode and random mode is enabled.

In FIG. 19, the algorithm ensures that the interleaved mode has an effect on the current loss ratio before queuing is returned to the random mode. The current loss ratio must be lower than twice the Target Loss Ratio for a time period of d times the max iterations before the random mode is enabled. To complete this, a loop is used to sample the current loss ratio. The loop is initialized at step 2300 and then waits for a delay period of d at step 2301. The current loss ratio is retrieved at step 2302 and checked at step 2303 to determine whether the current loss ratio exceeds twice the Target Loss Ratio. An affirmative answer at step 2303 causes the loop counter to be incremented at step 2304, and then step 2305 determines whether the loop count has reached the maximum iteration. If the answer is negative, the system returns to step 2301 and repeats steps 2302 and 2303. An affirmative answer at step 2305 causes the random mode to be enabled at step 2306.

Figure 20:
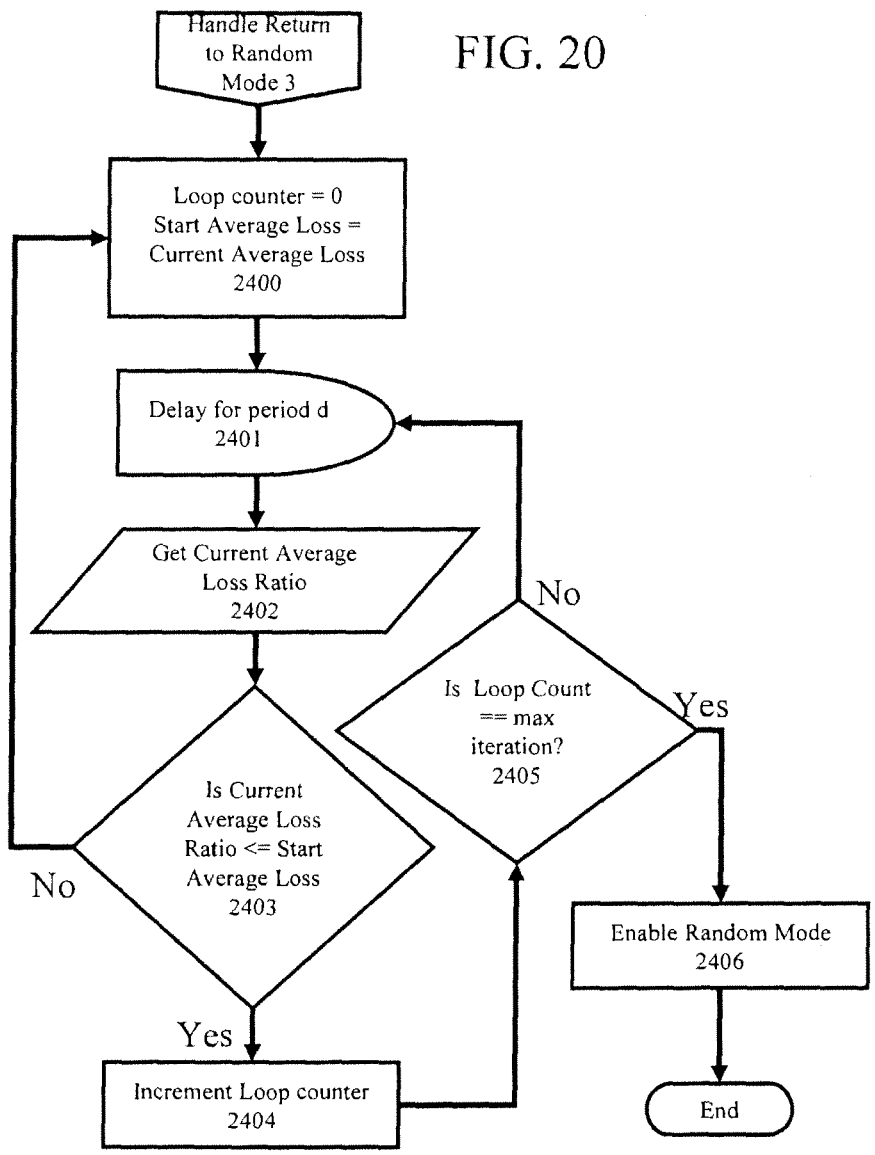
FIG. 20 is a flow chart illustrating another alternate algorithm which is executed when the intercepting network device is leaving interleaved mode and random mode is enabled.

FIG. 20 is similar to FIG. 19 with the exception that instead of using the current loss ratio, the average loss ratio is used. The loop is initialized at step 2400 by setting the loop counter to zero and setting the Start Average Loss to the Current Average Loss and, the system then waits for a delay period of d at step 2401. The current average loss ratio is retrieved at step 2402 and checked at step 2403 to determine whether the current average loss ratio exceeds the Start Average Loss. An affirmative answer at step 2403 causes the loop counter to be incremented at step 2404, and then step 2405 determines whether the loop count has reached the maximum iteration. If the answer is negative, the system returns to step 2401 and repeats steps 2402 and 2403. An affirmative answer at step 2405 causes the random mode to be enabled at step 2406.

Figure 21:
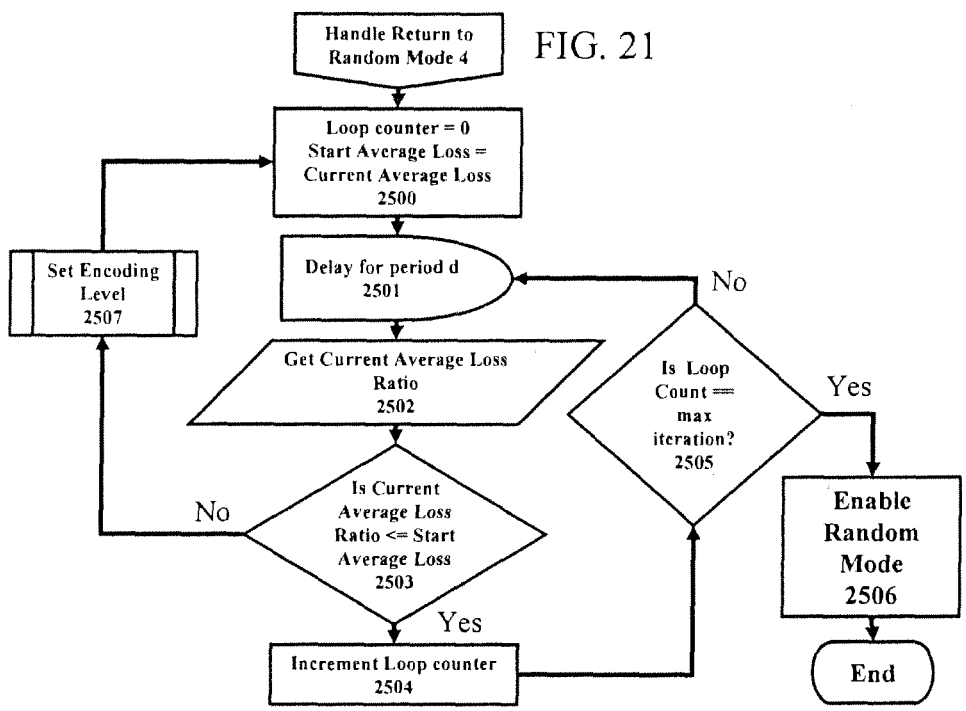
FIG. 21 is a flow chart illustrating another alternate algorithm which is executed when the intercepting network device is leaving interleaved mode and random mode is enabled.

FIG. 21 is similar to FIG. 20, except that changing the encoding level is also allowed. The loop is initialized in step 2500 by setting the loop counter to zero and setting the Start Average Loss to the Current Average Loss and, the system then waits for a delay period of d at step 2501. The current average loss ratio is retrieved at step 2502 and checked at step 2503 to determine whether the current average loss ratio exceeds the Start Average Loss. A negative answer at step 2503 adjusts the encoding level at step 25607 to handle the current average loss ratio and then returns to step 2500. An affirmative answer at step 2503 causes the loop counter to be incremented at step 2504, and then step 2505 determines whether the loop count has reached the maximum iteration. If the answer is negative, the system returns to step 2501 and repeats steps 2501-2503. An affirmative answer at step 2505 causes the random mode to be enabled at step 2506.

Figure 22:
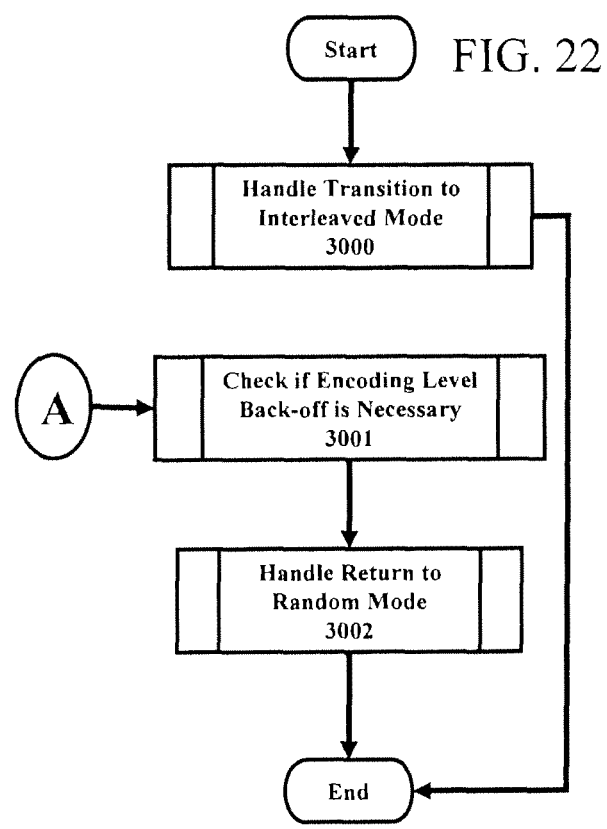
FIG. 22 is a flow chart illustrating the steps executed when the intercepting network device is handling burst loss using interleaved mode and encoding level back-off.

FIG. 22 illustrates an algorithm that combines the handling of both significant changes in the current loss ratio or burst loss exceeding twice the TLR. In this embodiment, the algorithm starts at step 3000 by determining if the encoding channel needs to transition to the interleaved mode. Assuming this is required, the algorithm then checks to see if encoder level back-off is required at step 3001. Regardless of whether back-off is required, the algorithm then determines when the encoding channel transitions back to the random mode at step 3002.

Handling the transition to the interleaved mode in step 3000 can be handled in the same way as in FIG. 18. Step 3002 looks at the transition back to the random mode, using any of the algorithms illustrated in FIGS. 18-21.

Figure 23:
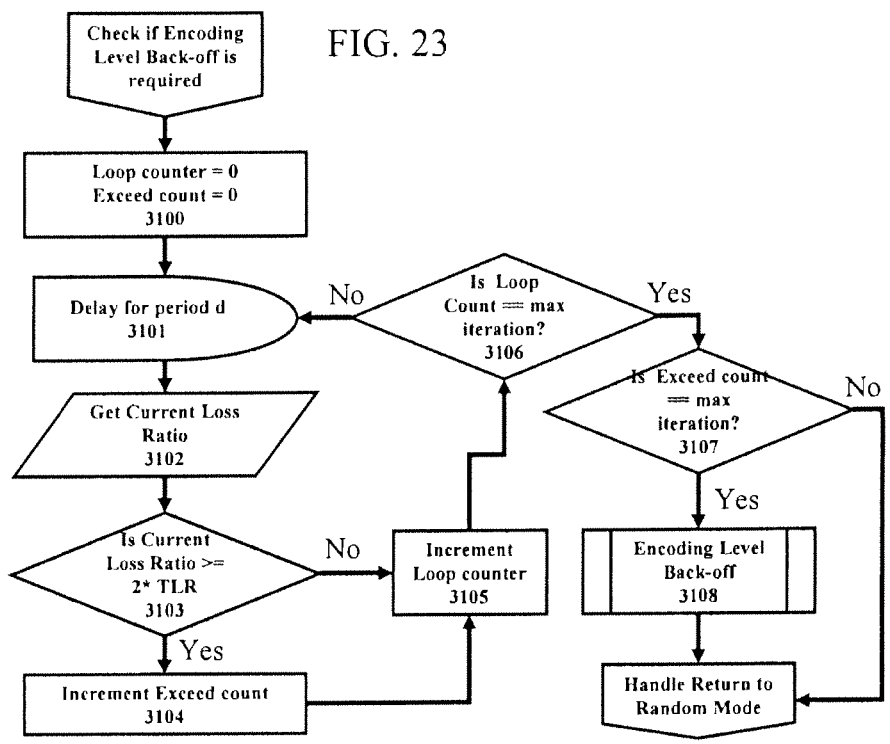
FIG. 23 is a flow chart illustrating the steps to determine if encoding level back-off is required when handling burst loss.

Determining whether back-off is required at step 3002 is illustrated in FIG. 23. This algorithm debounces the effect of transitioning from the random to the interleaved mode. This measurement should be done after an increase in encoding level. It loops for a period of delay d times max iterations and checks the current loss ratio. The loop, initialized at step 3100, has a delay period of d at step 3101. When this dely period expires, the current loss ratio is sampled at step 3102 and compared to twice the TLR at step 3103. If the current loss ratio is greater than twice the TLR, the exceed counter is incremented at step 3104. Otherwise, the loop counter is incremented at step 3105. This process continues until the loop counter reaches max iterations at step 2506. At this point, the exceed counter is checked at step 2507, and if it equals max iterations, encoding level back-off is enabled at step 2508. Otherwise, the algorithm proceeds on to handle the return to the random mode.

Figure 24:
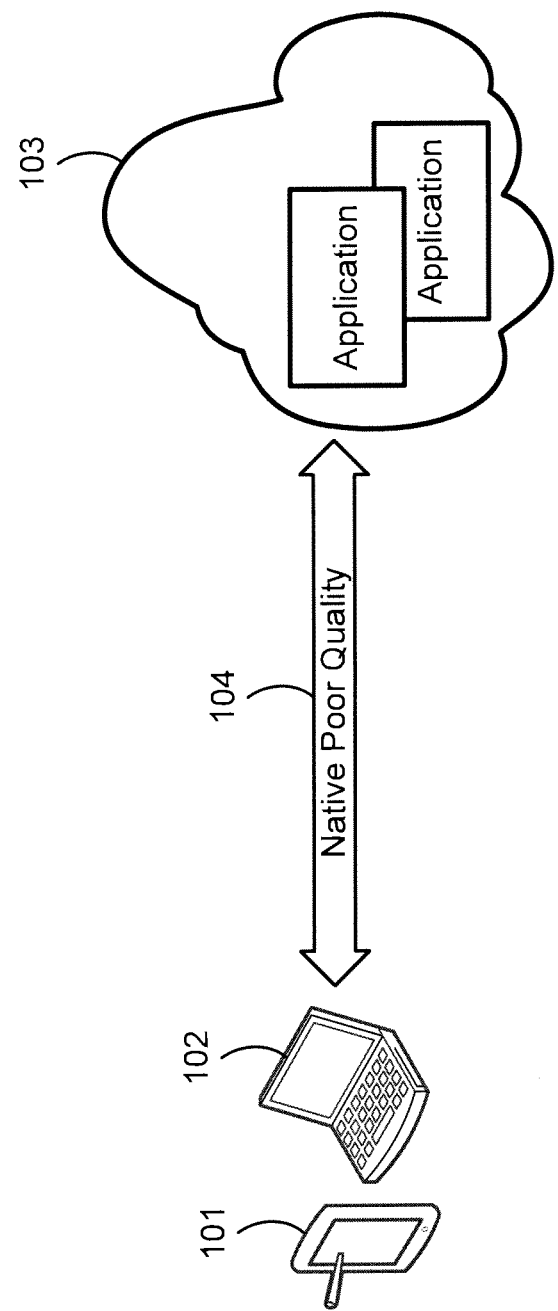
FIG. 24 is a representation of an existing network without performance enhancement.

In FIG. 24, devices 2401, 2402 access application servers 2403 (e.g. Youtube™ server) using native, poor quality, network connections 2404 with unreliable network performance.

There exist several Network Performance Enhancing Coding technique (NPEC). NPEC comprise any network coding techniques that use an encoder at one location and a decoder at a second location and wherein the performance of the network in the segment located between the encoder and the decoder is improved. NPEC include, for example the NPEC described above, as well as those described in U.S. Pat. No. 7,706,365 and U.S. Patent Publication No. 2011/0149087 or any other similar methods. NPEC generally require bookending, which means there needs to be an encoder/decoder pair at one end and a decoder/encoder pair at another end to handle bi-directional connections, because these techniques generally modify the standard protocols and the packets would not be recoverable if there is not a matching decoder on the other side.

Figure 25:
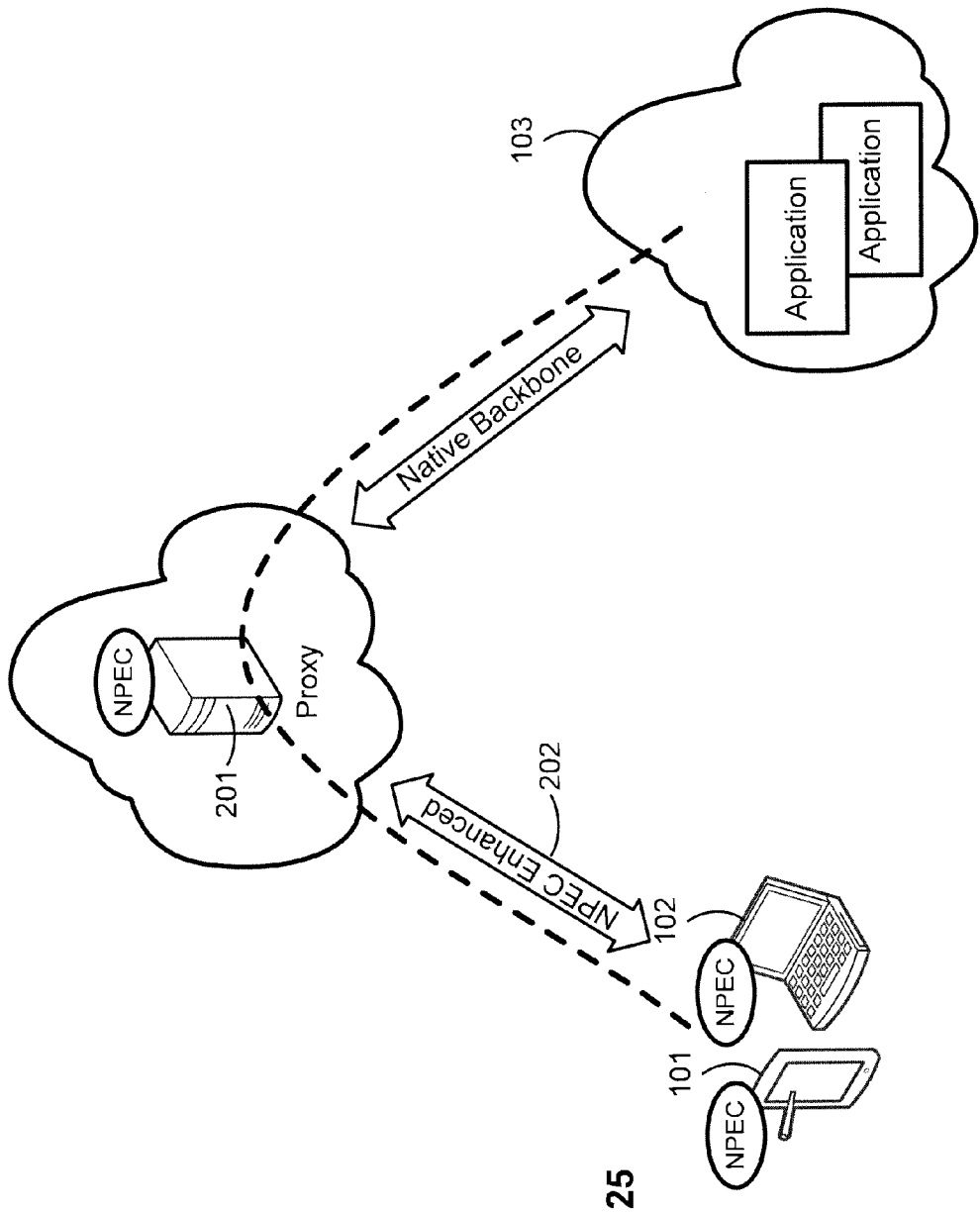
FIG. 25 is an example of a proxy server implementing performance enhancements.

FIG. 25 illustrates an embodiment where it is not possible to put the NPEC at the application server end. A proxy server 2501 is added in the network to implement the encoding/decoding of one or more NPEC mechanisms. Traffic is routed via the proxy server and the network segment 2502 between the device 2401, 2402 and the proxy server 2501 (usually the access network) is encoded/decoded based on a selected NPEC specification implemented in the proxy server 2404. As a result, the network segment has increased performance and reliability.

The proxy server 201 may be collocated with the application server 2403 such that there is minimum further performance degradation. In another embodiment, an NPEC server is deployed collocated to a proxy server.

Using the NPEC described above in a proxy server, backup applications can reduce the backup time by 80%. Disaster recovery can be improved by 5 times and large file transfers can be reduced by 6 times.

Figure 26:
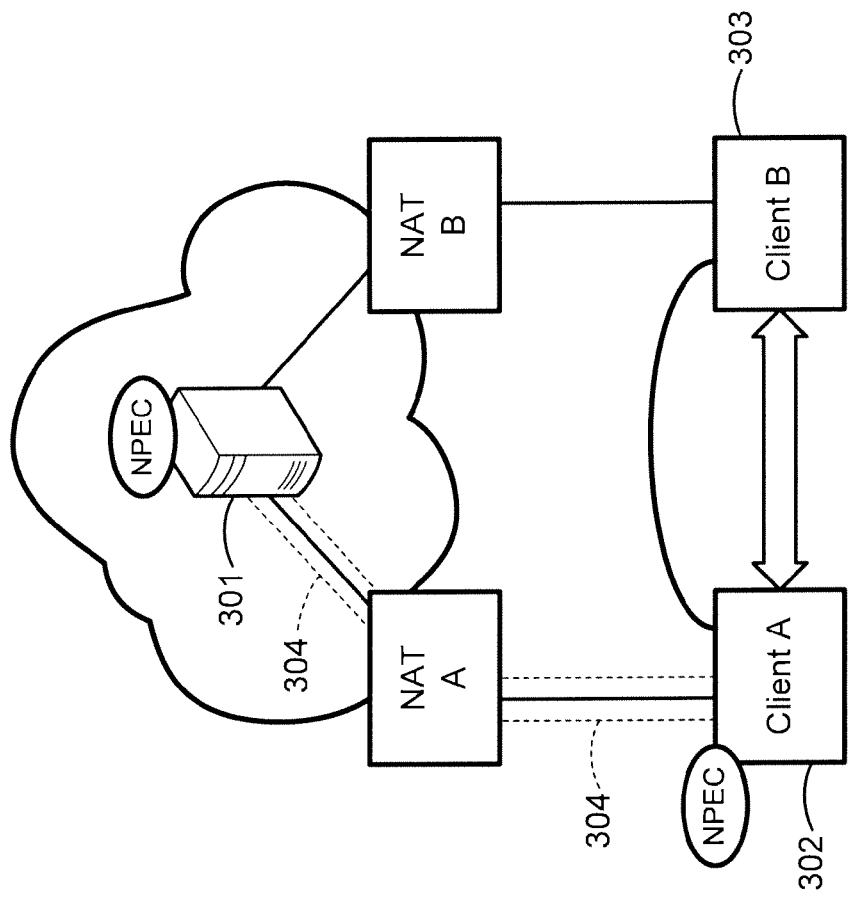
FIG. 26 is an example of a TURN server with added performance enhancements.

Traversal Using Relays around NAT (TURN) is a protocol that allows for an element behind a Network Address Translator (NAT) or firewall to receive incoming data over TCP or UDP connections. FIG. 26 shows an example where a TURN server 2601 implements an NPEC service and one or both of the clients 2602, 2603 can benefit from the enhanced/reliable quality in the network segment 2604 protected by the NPEC.

Any performance sensitive applications can be designed to implement the encoding/decoding of a NPEC and then access the NPEC service through a proxy server or TURN server. Alternatively, the device may already include one or more NPEC capable driver.

Another embodiment of offering quality as a service is through the use of VPN servers. One or more NPEC encoding/decoding mechanism can be implemented in the VPN server and in the VPN clients so that at least the portion between the client and the VPN server has enhanced quality.

The proxy server embodiment can optionally gather measurements to ensure the performance of the NPEC managed segments is adequate and performance analysis can be done on the measurements to ensure the network engineering is adequate.

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention. For example, specific details are not provided as to whether the embodiments of the invention described herein are implemented as a software routine, hardware circuit, firmware, or a combination thereof.

Embodiments of the invention may be implemented in a network having endpoints, such as servers or other computing devices, and associated encoding components. The encoding components, and the described methods, can be implemented in hardware, software or a combination thereof. Those portions that are implemented in software can be represented as a software product stored in a machine-readable medium (also referred to as a computer-readable medium, a processor-readable medium, or a computer usable medium having a computer readable program code embodied therein). The machine-readable medium may be any suitable tangible medium, including magnetic, optical, or electrical storage medium including a diskette, compact disk read only memory (CD-ROM), memory device (volatile or non-volatile), or similar storage mechanism. The machine-readable medium may contain various sets of instructions, code sequences, configuration information, or other data, which, when executed, cause a processor to perform steps in a method. Those of ordinary skill in the art will appreciate that other instructions and operations necessary to implement the described embodiments may also be stored on the machine-readable medium. Software running from the machine readable medium may interface with circuitry to perform the described tasks.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

The invention claimed is:

1. A method of improving the performance of an access network for coupling user devices to an application server, said method comprising
- encoding data at a user device using a network performance enhancing coding (NPEC),
- creating an encoding channel between said user device and an intermediate server coupled to said application server, wherein said intermediate server being selected from the group consisting of proxy servers, traversal using relays-around-network-address-translator (TURN) servers and virtual-private-network (VPN) servers,
- wherein said creating an encoding channel between said user device and an intermediate server coupled to said application server further comprises:
- setting one or more target loss ratios for said encoding channel,
- wherein said encoding channel carries one or more types of traffic, and each of said one or more target loss ratios corresponds to one of the said one or more types of traffic, and
- wherein one or more parameters of said encoding channel are set depending on the one or more target loss ratios,
- transmitting the encoded data over said encoding channel to said intermediate server,
- decoding the encoded data at said intermediate server using said NPEC,
- transmitting the decoded data to said application server.

2. The method of claim 1 wherein said intermediate server is a proxy server.

3. The method of claim 2 wherein said proxy server is co-located with said application server.

4. The method of claim 1 wherein said intermediate server performs encoding and decoding using one or more NPEC.

5. The method of claim 1 further comprising receiving application data from said application server at said intermediate server; encoding said application data at said application server using said NPEC; transmitting the encoded application data to said user device over said encoding channel; and decoding said the encoded application data at said user device using said NPEC.

6. The method of claim 1 in which said intermediate server comprises an NPEC server collocated with a proxy server.

7. The method of claim 1, wherein said one or more parameters of said encoding channel comprises an encoding rate.

8. A system for improving the performance of an access network for coupling user devices to an application server, said system comprising
- a user device and an intermediate server coupled via said access network,
  - wherein said intermediate server is selected from the group consisting of proxy servers, traversal using relays-around-network-address-translator (TURN) servers and virtual-private-network (VPN) servers,
  - further wherein an encoding channel is created between said user device and said intermediate server,
    - one or more target loss ratios are set for said encoding channel,
    - said encoding channel carries one or more types of traffic, and
    - each of said one or more target loss ratios corresponds to one of the said one or more types of traffic; and
  - said user device having a processor to encode data using a network performance enhancing coding (NPEC), and to transmit the encoded data via said access network to said intermediate server; and
- said intermediate server receives said encoded data, and further wherein said intermediate server comprises a processor to decode the encoded data using said NPEC, and
  - transmit the decoded data to said application server.

* * * * *